United States Patent [19]

Yoo

[11] Patent Number: 5,965,919
[45] Date of Patent: Oct. 12, 1999

[54] SEMICONDUCTOR DEVICE AND A METHOD OF FABRICATING THE SAME

[75] Inventor: Ji-Hyoung Yoo, Kyungki-do, Rep. of Korea

[73] Assignee: Samsung Electronics Co., Ltd., Suwon, Rep. of Korea

[21] Appl. No.: 08/734,063

[22] Filed: Oct. 18, 1996

[30] Foreign Application Priority Data

Oct. 19, 1995 [KR] Rep. of Korea ..................... 95-36192
Dec. 2, 1995 [KR] Rep. of Korea ..................... 95-46234

[51] Int. Cl.$^6$ .................................................. H01L 27/01
[52] U.S. Cl. ........................... 257/351; 257/401; 257/369; 257/408; 257/900
[58] Field of Search ................................. 257/900, 327, 257/344, 347, 351, 369, 401, 408

[56] References Cited

U.S. PATENT DOCUMENTS

| | | | |
|---|---|---|---|
| 4,037,308 | 7/1977 | Smith | 257/327 |
| 4,729,002 | 3/1988 | Yamazaki | 257/387 |
| 5,225,703 | 7/1993 | Nakatani | 257/900 |
| 5,670,822 | 9/1997 | Jang | 257/565 |

*Primary Examiner*—Mark V. Prenty

[57] ABSTRACT

A CMOS device is disclosed in which p-channel and n-channel MOS transistors are formed on the same substrate. Each of the MOS transistors has a gate insulating layer formed on the substrate; a gate having a gate body and a spacer formed on both sidewalls of the gate body; a drain region of a first conductivity type formed in the substrate and beneath the gate body; a channel region of a second conductivity type formed at both sides of the first heavily doped impurity region and beneath the spacer; and a source region of the first conductivity type formed in the substrate and between the channel region and the device isolating region. With this CMOS device, the channel length can be controlled to about 0.1 mm and less and hot-carrier effect can be minimized.

17 Claims, 19 Drawing Sheets

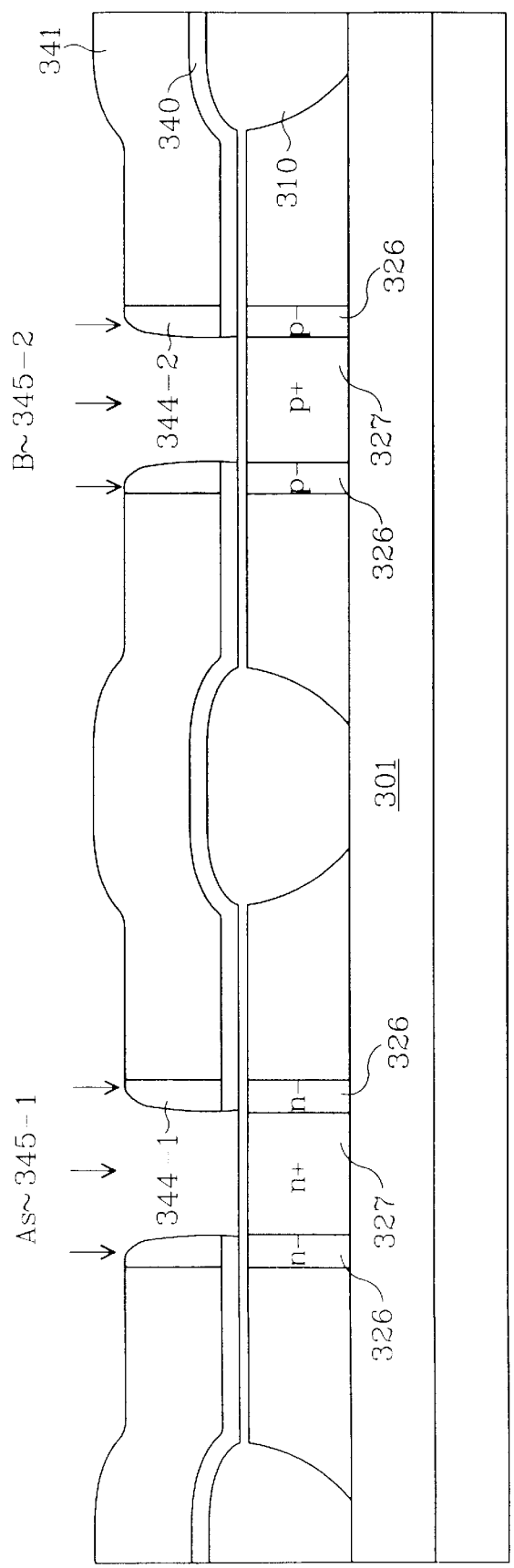

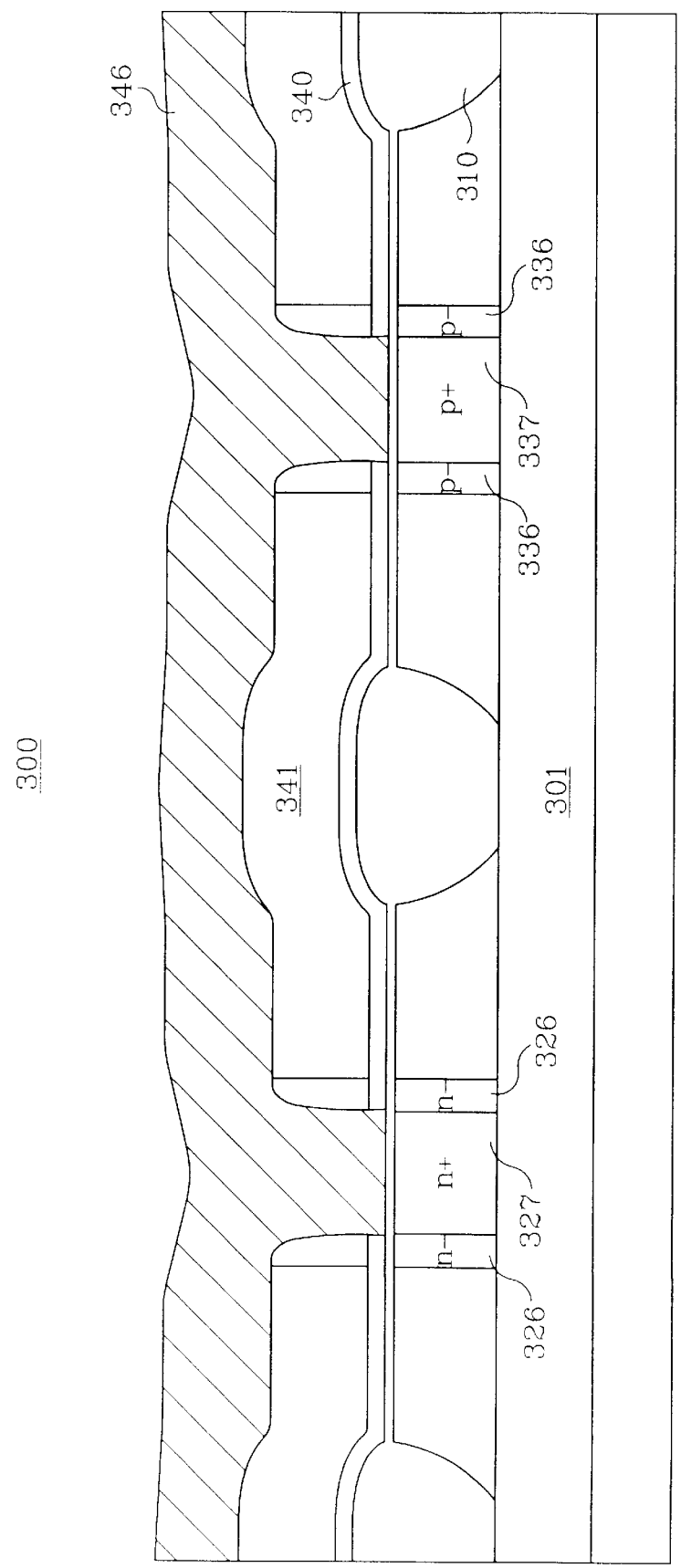

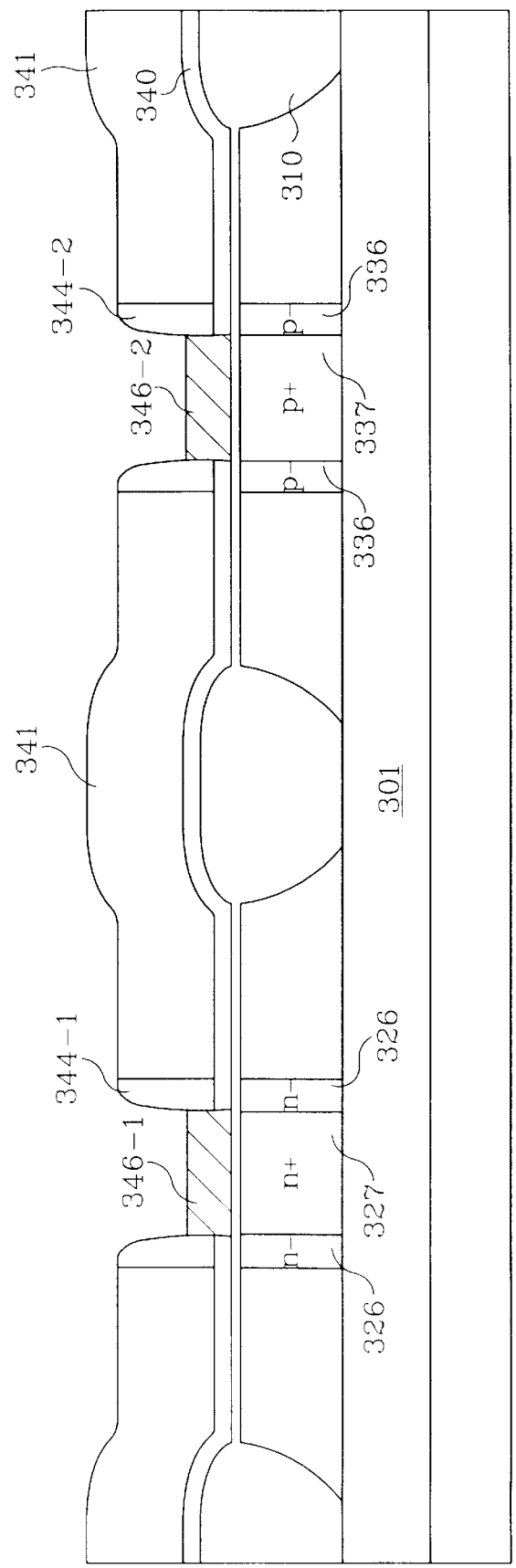

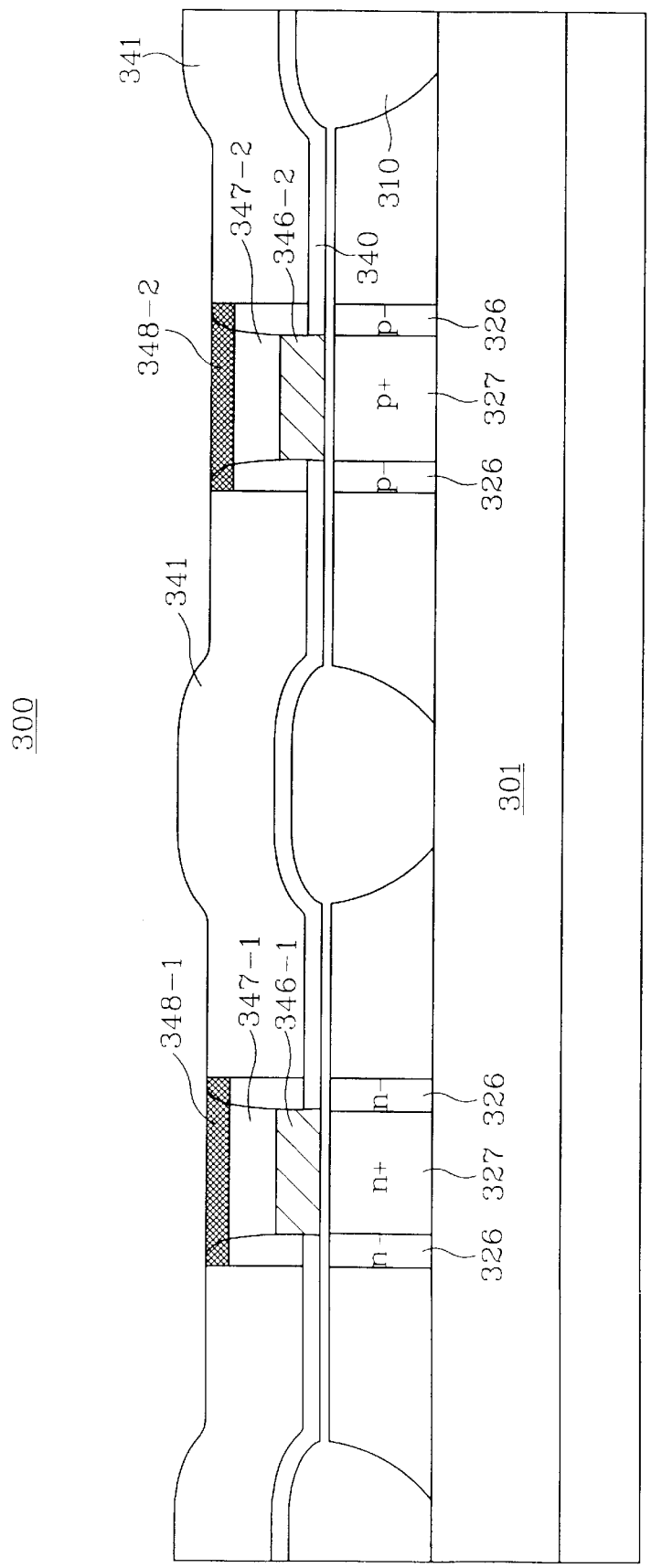

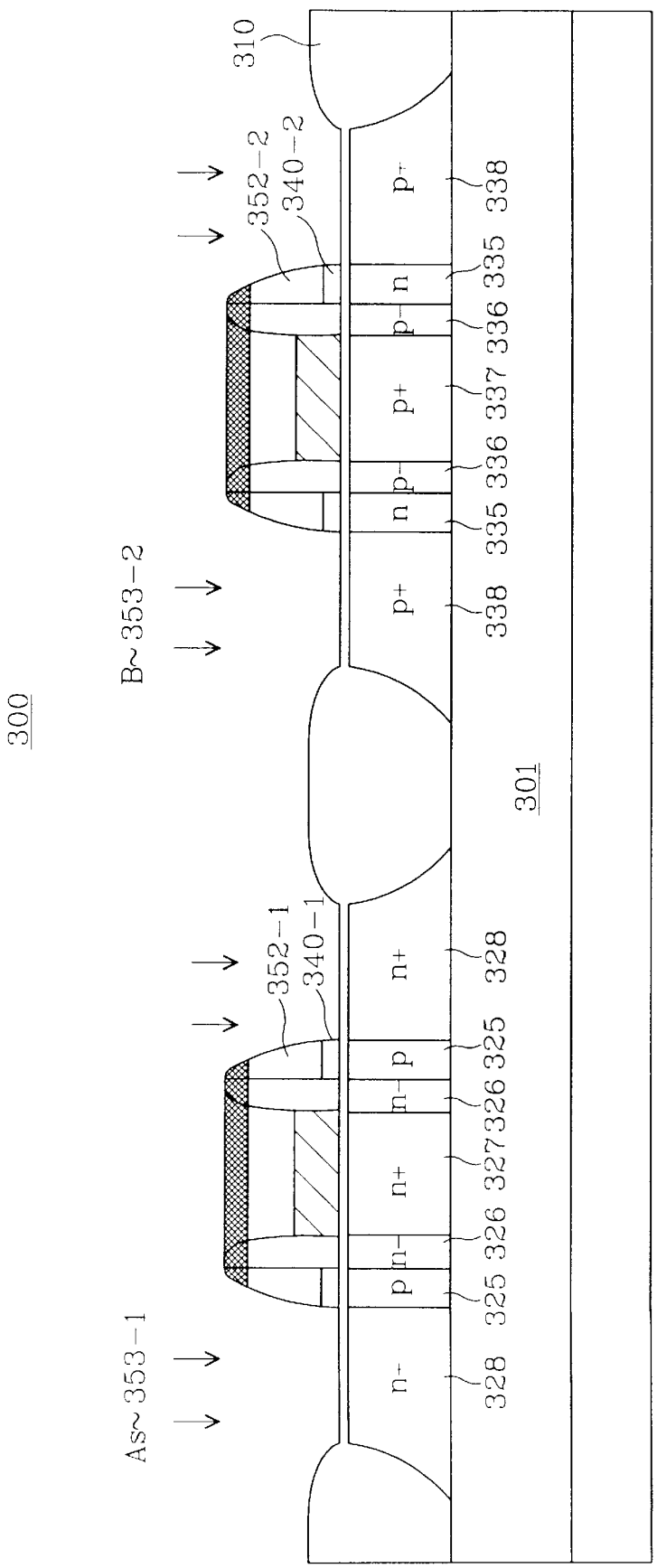

SEMICONDUCTOR DEVICE AND A METHOD OF FABRICATING THE SAME

BACKGROUND OF THE INVENTION

The present invention relates to fabrication of a semiconductor device. More particularly, the present invention relates to a CMOS (complementary metal oxide semiconductor) device wherein p-channel and n-channel MOS (metal oxide semiconductor) transistors are formed on a same substrate. The present invention also relates to a method for fabricating this CMOS device.

With the recent improvement in semiconductor fabricating apparatuses such as photo and etching equipments, MOS (metal oxide semiconductor) devices may be designed and fabricated to be less than submicron or sub-half micron in size. It is, however, difficult to easily control a channel length of 0.1 to 0.2 mm by using conventional equipment. As the channel of a MOS transistor becomes shorter and shorter, this increases the hot-carrier effect on the channel.

FIGS. 1A through 1C show a conventional process steps of fabricating a typical MOS transistor with a lightly doped drain (LDD) structure.

Referring to FIG. 1A, a gate oxide layer 12 and a gate 13 are sequentially formed on a p-type semiconductor substrate 11. A lightly doped source/drain region 15 is then formed in the substrate 1 using ion implantation with the gate 13 as a mask.

As shown in FIG. 1B, after an insulating layer 16 is formed over the substrate, an anisotropic etching is carried out to selectively remove the insulating layer 16. As a result, a spacer 17 is formed on both sidewalls of the gate 13, as shown in FIG. 1C.

Subsequently, ion implantation using $n^+$-type impurity ions as dopants is carried out to form an $n^+$-type source/drain region 19, as shown in FIG. 1C. During this ion implantation, the gate 13 and the spacer 17 serve as a mask. Therefore, an LDD structure can be formed.

Conventional MOS transistors having the above LDD structure may restrain an hot-carrier effect occurring due to the short-channel of the MOS transistor. But, as a CMOS device becomes smaller and smaller, approaching less than a half-micron or sub-half micron in size, each channel length of MOS transistors therein becomes shorter. This raises serious problems that it is both impossible to completely restrain the occurrence of a hot-carrier effect in the CMOS device and it is difficult to fabricate MOS transistors having a channel length of about 0.1 mm and less because of the practical processing limitation of a photo equipment.

SUMMARY OF THE INVENTION

It is therefore an object of the present invention to provide a CMOS device in which each channel length of MOS transistors therein may be controlled in the range of about 0.1 mm and less by means of a well known spacer forming technique in the art, a method of fabricating the same.

It is a further object of the present invention to provide a CMOS device with an LDD structure in which each gate of MOS transistors therein is wholly overlapped on an LDD region as well as a channel region so as to considerably restrain a hot-carrier effect, and a method of the same.

It is another object of the present invention to provide a CMOS device with an LDD structure in which each channel region of MOS transistors therein is formed as a dual surface channel so as to prevent the occurrence of a short channel effect caused due to a buried channel region, and a method of fabricating the same.

It is an additional object of the present invention to provide a CMOS device with an LDD structure in which two source regions of each MOS transistor therein are formed having a drain region interposed therebetween so as to improve a current driving capacity.

It is another object of the present invention to provide a CMOS device with an LDD structure in which a thick oxide film is formed on each drain region of MOS transistors therein so as to significantly reduce a gate-to-drain parasitic capacitance occurring due to a GOLD (gate overlapped LDD) structure.

It is still another object of the present invention to provide a CMOS device with an LDD structure in which a heavily doped source region of each MOS transistor therein is formed in self-alignment on both sides of a drain region without the formation of LDD region so as to reduce a source resistance.

According to one aspect of the present invention, a semiconductor device comprises n-channel and p-channel MOS (metal oxide semiconductor) transistors which are electrically isolated by a device isolating region on a same SOI (silicon on insulator) substrate; and each of the MOS transistors having a gate insulating layer formed on the substrate; a gate having a gate body and a spacer formed on both sidewalls of the gate body; a drain region of a first conductivity type formed in the substrate and beneath the gate body; a channel region of a second conductivity type formed at both sides of the first heavily doped impurity region and beneath the spacer; and a source region of the first conductivity type formed in the substrate and between the channel region and the device isolating region.

A method of fabricating the semiconductor device according to the aspect of the present invention comprises the steps of preparing an SOI (silicon on insulator) substrate; forming a device isolating region on the substrate to define n-channel and p-channel MOS (metal oxide semiconductor) transistor regions which are electrically isolated by the device isolating region on the substrate; forming a gate insulating layer on the substrate; forming a first polysilicon layer on the gate insulating layer; forming an insulating layer over the first polysilicon layer; selectively removing the insulating layer to form a window for each of the MOS transistors; injecting impurity ions through the window into the substrate to form a heavily doped drain region for each of the MOS transistors; forming a second polysilicon layer on the first polysilicon layer in the window; forming a conductive layer on the second polysilicon layer in the window; removing the insulating layer to expose the first polysilicon layer; injecting impurity ions through the exposed part of the first polysilicon layer into the substrate to form a lightly doped region serving as a channel; forming a spacer on both sidewalls of the second polysilicon layer and the conductive layer; and injected impurity ions into a part of the lightly doped region to form a heavily doped source region for each of the MOS transistors.

According to another aspect of the present invention, a semiconductor device comprises n-channel and p-channel MOS (metal oxide semiconductor) transistors which are electrically isolated by a device isolating region on a same SOI (silicon on insulator) substrate; and each of the MOS transistors having a gate insulating layer formed on the substrate; an insulator formed on a part of the gate insulating layer; a gate surrounding the insulator and having a gate body and a spacer formed on both sidewalls of the gate body; a heavily doped drain region of a first conductivity type formed in the substrate and beneath the insulator; a lightly doped drain region of the first conductivity type formed at both sides of the heavily doped drain region and beneath the gate body; a channel region of a second conductivity type formed between the lightly doped drain region and the device isolating region and beneath the spacer; and a source region of the first conductivity type formed in the substrate and between the channel region and the device isolating region.

A method of fabricating the semiconductor device according to another aspect of the present invention comprises the steps of preparing an SOI (silicon on insulator) substrate; forming a device isolating region on the substrate to define n-channel and p-channel MOS (metal oxide semiconductor) transistor regions which are electrically isolated by the device isolating region on the substrate; forming a gate insulating layer on the substrate; forming a first polysilicon layer on the gate insulating layer; forming a first insulating layer over the first polysilicon layer; selectively removing the first insulating layer to form a window for each of the MOS transistors; injecting impurity ions through the window into the substrate to form a lightly doped drain region for each of the MOS transistors; forming a first spacer on both sidewalls of the window; injecting impurity ions through the window into a part of the lightly doped drain region by using the first spacer as a mask to form a heavily doped drain region for each of the MOS transistors; forming a second insulating layer on the gate insulating layer in the window; forming a second polysilicon layer on the second insulating layer in the window; forming a conductive layer on the second polysilicon layer in the window; removing the first insulating layer to expose the first polysilicon layer; injecting impurity ions through the exposed first polysilicon layer into the substrate to form a lightly doped channel region; forming a second spacer on both sidewalls of the first spacer and the conductive layer; and injecting impurity ions into a part of the lightly doped channel region to form a heavily doped source region for each of the MOS transistors.

BRIEF DESCRIPTION OF THE DRAWINGS

This invention may be better understood and its objects will become apparent to those skilled in the art by reference to the accompanying drawings as follows:

FIGS. 8A through 8J are flow diagrams showing by sequential cross-sectional representation the process steps of a preferred embodiment for fabricating the CMOS device of FIG. 6.

DETAILED DESCRIPTION OF THE PREFERRED EMBODIMENTS

Figure 1A:
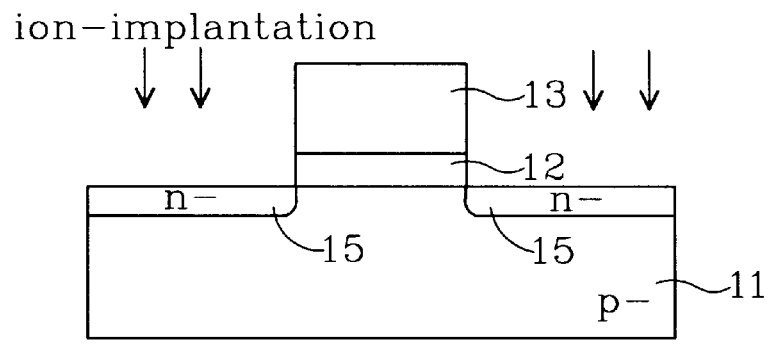
FIGS. 1A through 1C are flow diagrams showing by sequential cross-sectional representation the process steps of a conventional method for fabricating a semiconductor device.
Figure 1B:
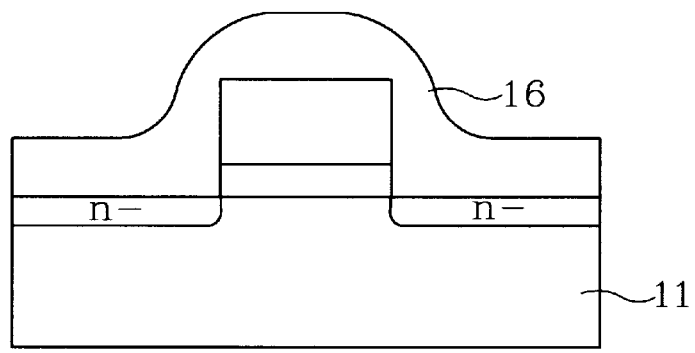
Figure 1C:
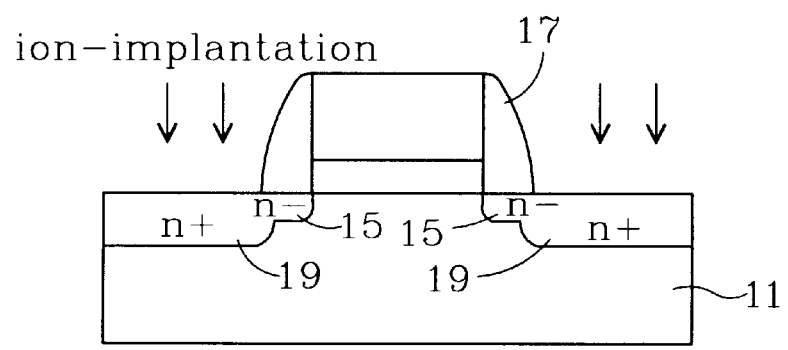

The present invention will now be described more fully hereinafter with reference to the accompanying drawings, in which preferred embodiments of the invention are shown. This invention may be, however, embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

EXAMPLE 1

Figure 2:
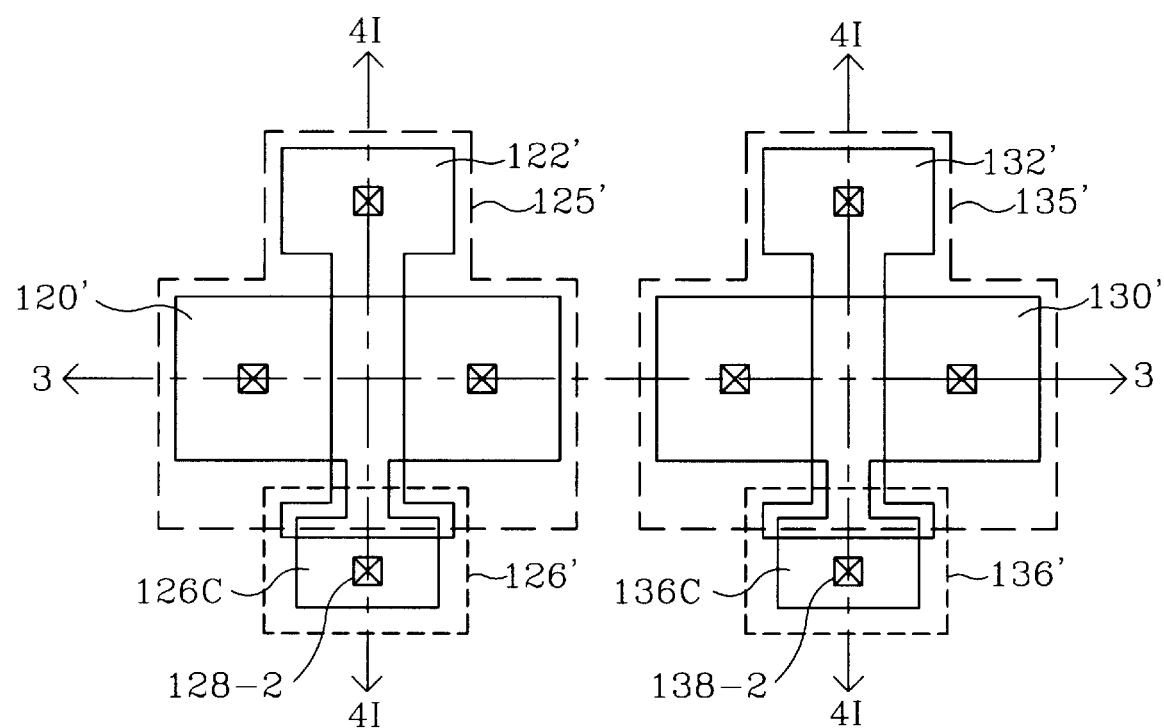
FIG. 2 is a view showing a layout of a CMOS device in accordance with a first preferred embodiment of the present invention.
Figure 3:
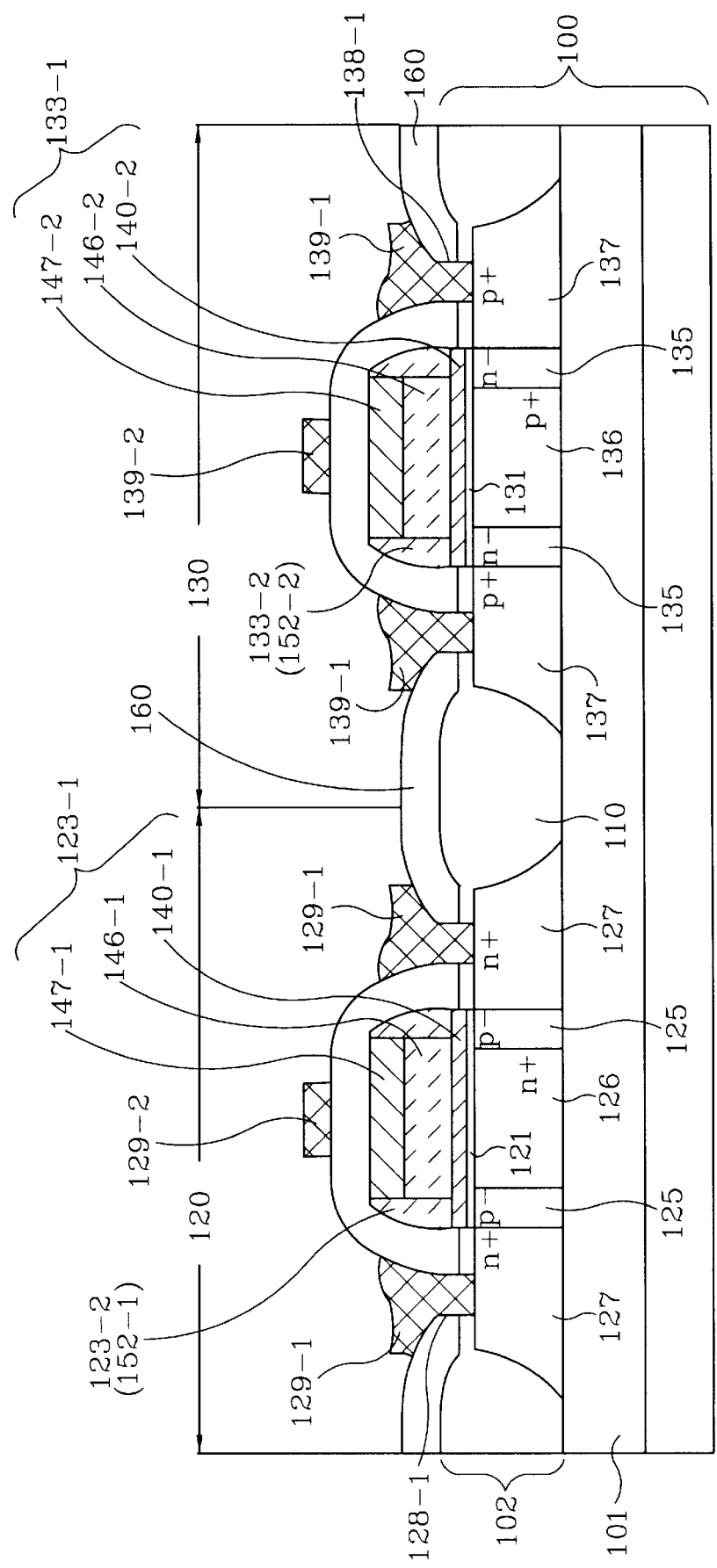
FIG. 3 is a cross-section view taken along the line 3—3 of FIG. 2.

FIG. 2 shows a layout of a CMOS device in accordance with a first preferred embodiment of the present invention, and FIG. 3 shows a vertical structure of the CMOS device by a cross-section view taken along the line 3—3 of FIG. 2.

Referring to FIG. 3, a novel CMOS device according to the present invention includes a silicon on insulator (SOI) substrate 100 wherein p-channel and n-channel MOS transistor regions 120 and 130 are defined by a device isolating region 110, a p-channel MOS ("PMOS") transistor formed in the p-type MOS transistor region 120, and an n-channel MOS ("NMOS") transistor formed in the NMOS transistor region 130. Each gate of the MOS transistors is overlapped on a drain region besides a channel region. The device isolating region 110 is formed to the top surface of an insulating layer 101 which is formed in the SOI substrate, so that the transistor regions 120 and 130 are electrically isolated from each other. In the first preferred embodiemnt, the SOI substrate 100 comprises a silicon layer 102 which is formed on the insulating layer 101 and in the range of 1000 to 2000 Å thick.

As shown in FIG. 3, the PMOS transistor includes a gate insulating layer 121 which is formed on the SOI substrate 100, a gate 123 having a gate body 123-1 formed on the gate insulating layer 121 and a spacer 123-2 formed on both sidewalls of the gate body 123-1, a first $n^+$-type impurity region 126 formed in the SOI substrate beneath the gate body 123-1, a $p^-$-type impurity region 125 formed in the SOI substrate under the spacer 123-2 and on both sides of the first $n^+$-type impurity region 126, and a second $n^+$-type impurity region 127 formed between the $p^-$-type impurity region 125 and the device isolating region 110. In the first preferred embodiment, the gate insulating layer 121 comprises an oxide layer. The first and second $n^+$-type impurity regions 126 and 127 function as drain and source regions doped with dopants of high concentration, respectively, and the $p^-$-type impurity region 125 as a channel region doped with dopants of low concentration.

Also, the PMOS transistor includes a gate insulating layer 131 which is formed on the SOI substrate 100, a gate 133 having a gate body 133-1 formed on the gate insulating layer 131 and a spacer 133-2 formed on both sidewalls of the gate body 133-1, a first $p^+$-type impurity region 136 formed in the SOI substrate beneath the gate body 133-1, an $n^-$-type impurity region 135 formed in the SOI substrate under the spacer 133-2 and on both sides of the first $p^+$-type impurity region 136, and a second $p^+$-type impurity region 137 formed between the $n^-$-type impurity region 135 and the device isolating region 110. In the first preferred embodiment, the gate insulating layer 131 comprises an oxide layer. The first and second p⁺-type impurity regions 136 and 137 function as drain and source regions doped with dopants of high concentration, respectively, and the n⁻-type impurity region 135 as a channel region doped with dopants of low concentration.

With reference again to the FIGS. 2 and 3, the CMOS device according to the first preferred embodiment of the invention further includes an interlayer insulating layer 160 formed over the substrate, a contact hole 128-1 formed on the p⁺-type source region 127 for the PMOS transistor, a contact hole 138-1 formed on the source region 137 for the NMOS transistor, a source electrode 129-1 of the PMOS transistor formed on the interlayer insulating layer 160 and connected to the source region 127 through the contact hole 128-1, and a source electrode 139-1 of the NMOS transistor formed on the interlayer insulating layer 160 and connected to the source region 137 through the contact hole 138-1.

In the CMOS device, gate 123 for the PMOS transistor is formed on the drain region 126 in addition to the channel region 125, and also the gate 133 for the NMOS transistor is formed on the drain region 136 besides the channel region 135, which result in a decrease in the damage due to the occurrence of a hot carrier in case of a short channel.

Moreover, since the drain regions 126 and 136 for the MOS transistors are overlapped in the gates 123 and 133, respectively, the contact holes 128-2 and 138-2 (shown in FIG. 2) for forming drain electrodes are not shown in FIG. 3.

To form the contact holes 128-2 and 138-2 for forming drain electrodes of the PMOS and NMOS transistors, as shown in FIG. 2, the CMOS device further has drain contact regions 126C and 136C, each of which extends from a corresponding drain region to the end of a corresponding gate. The contact holes 128-2 and 138-2 are respectively formed in the drain contact regions 126C and 136C, as shown in FIG. 2, and thus each of the drain electrodes 129-2 and 139-2 is electrically connected to each of the drain regions 126 and 136. The channel regions 125 and 135 are also formed in self-alignment under the spacers 123-2 and 133-2 respectively. In this way, the channel length for each MOS transistor can be controlled to be about 0.1 mm.

In the PMOS transistor, the gate body 123-1 (shown in FIG. 3) comprises a lower polysilicon layer 140-1 which is formed on the gate insulating layer 121, an upper polysilicon layer 146-1 and a tungsten silicide layer 147-1 which are sequentially formed on the lower polysilicon layer 140-1. The spacer 123-2 comprises a polysilicon layer 152-1 (shown in FIG. 4J).

In the NMOS transistor, the gate body 133-1 comprises a lower polysilicon layer 140-2 which is formed on the gate insulating layer 131, an upper polysilicon layer 146-2 and a tungsten silicide 147-2 which are sequentially formed on the lower polysilicon layer 140-1. The spacer 133-2 comprises a sidewall polysilicon layer 152-2 (shown in FIG. 4J). The polysilicon gate for PMOS transistor is doped with n⁺-type dopant and the polysilicon gate for NMOS transistor is doped with p⁺-type dopant. Each MOS transistor has the polysilicon gate functioning as a dual-gate capable of driving two channel regions 125 beneath the gate. As a result, each MOS transistor having the dual-gate allows for functioning as a surface channel CMOS.

Hereinafter, a preferred method of forming the CMOS device of FIG. 2 will be described with reference to FIGS. 4A through 4J.

Figure 4A:
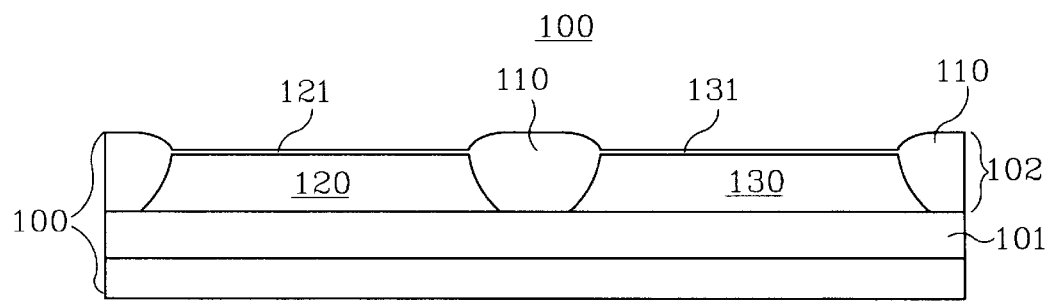
FIGS. 4A through 4J are flow diagrams showing by sequential cross-sectional representation the process steps of a preferred embodiment for fabricating the CMOS device of FIG. 2.

Referring to FIG. 4A, a SOI substrate 100 which has an insulating layer 101 (i.e., an oxide layer) and a silicon layer 102 of 1000 to 2000 Å is prepared. Preferably, the silicon layer 102 which is not doped any kinds of dopants is used in this method. Next, a local oxidation of silicon (LOCOS) process is performed using an active region defining mask 120' or 130' (shown in FIG. 2) to form a device isolating region 110 in contact with the insulating layer 101 of the SOI substrate 100. The silicon layer 102 is then divided into two regions, i.e., PMOS and NMOS transistor regions 120 and 130, which are electrically isolated by the device isolating region 110. A thin oxide layer is then formed by thermally oxidizing a face of the SOI substrate 100. The thin oxide layer is formed in the range of about 150 to 200 Å thick and divided into two oxide regions, one of which is formed on the PMOS transistor region 120 to be used as a gate insulating layer 121 for a PMOS transistor, and the other on the NMOS transistor region 130 to be used as a gate insulating layer 131 for an NMOS transistor, as described more fully hereinbelow.

Figure 4B:
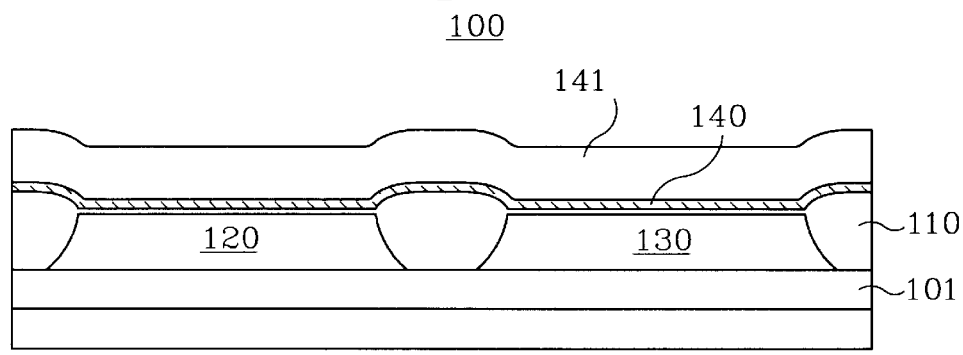

As illustrated by FIG. 4B, a polysilicon layer 140 and a low temperature oxide (LTO) layer 141 are sequentially formed on the whole surface of the SOI substrate. The polysilicon layer 140 is preferably not doped with any kinds of dopants and is preferably about 500 Å in thickness. The LTO layer 141 formed on the polysilicon layer 140 may be formed in the range of about 3000 to 4000 Å thick.

Figure 4C:
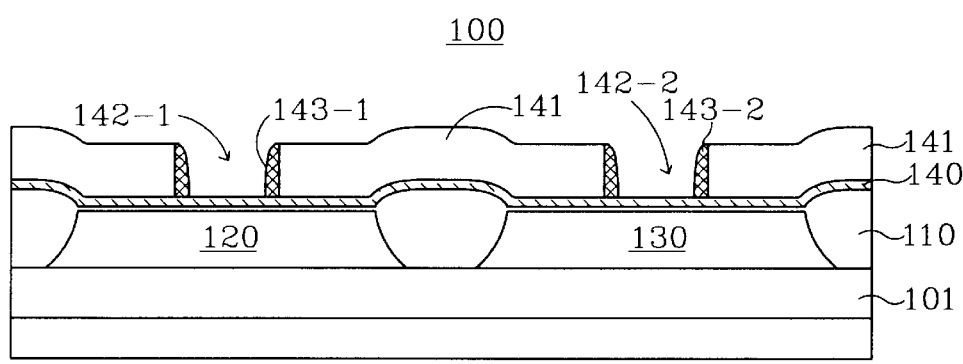

With reference to FIG. 4C, the LTO layer 141 is selectively removed by an etching process using a gate forming mask 122' or 132' (shown in FIG. 2) to form windows 142-1 and 142-2 corresponding to the transistor regions 120 and 130. During the etching process, the undoped polysilicon layer 140 is used as an etching stopper. Next, nitride spacers 143-1 and 143-2 are formed on exposed sidewalls of the LTO layer 141. The nitride spacers 143-1 and 143-2 may be formed by depositing a layer of nitride, preferably about 1000 Å thick, over the whole surface of the SOI substrate and then etching the deposited nitride layer by using an RIE (reactive-ion etching) process to define the spacers 143-1 and 143-2 on both sidewalls of the LTO layer 141.

Figure 4D:
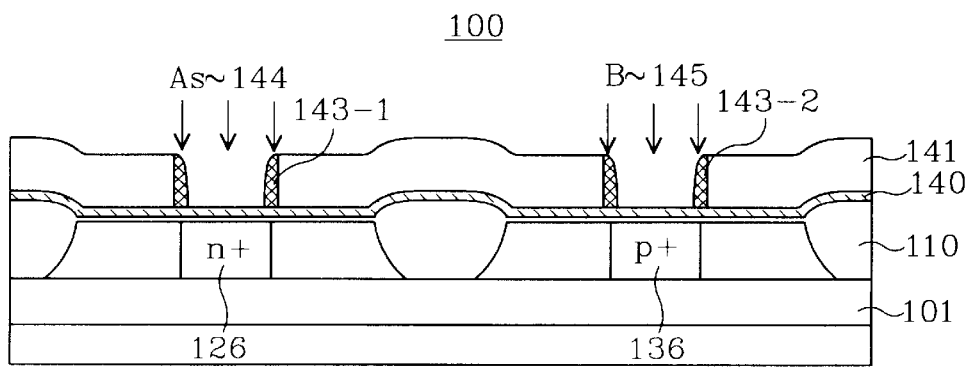

Subsequently, a heavily doped drain region 126 is selectively formed by an n⁺-type ion implantation using a source forming mask 125' (shown in FIG. 2). The drain region 126 may be formed by heavily implanting arsenic ions 144 as dopants via the window 142-1 into the silicon layer 102 of the n-type MOS transistor region 120, as shown in FIG. 4D. Also a heavily doped drain region 136 is selectively formed by a p⁺-type ion implantation using a source forming mask 135' (shown in FIG. 2). The drain region 136 may be formed by heavily implanting boron ions 145 as dopants via the window 142-2 into the silicon layer 102 of the NMOS transistor region 130, as shown in FIG. 4D. The dopants injected into the drain regions 126 and 136 are diffused to side-directions of the drain regions by a following thermal treatment. This side-diffusion of ions causes a problem that the diffused ions intrude into channel regions of low concentration, which become smaller and smaller. Accordingly, the nitride spacers 143-1 and 143-2 on both sidewalls of the LTO layer 141 are provided to prevent the injected ions from being diffused into the channel regions. The width of each nitride spacer may be determined by the magnitude of the side-diffusion of ions. In other word, a distance between a channel region (to be formed by following process) and the ion injected region serving as the drain region is longer by each nitride spacer. This means that the channel region can be considerably maintained having a desired length even though the side-diffusion of ions is generated. If the side-diffusion is extreme, the nitride spacer 143 needs to be formed as wider as possible.

Figure 4E:
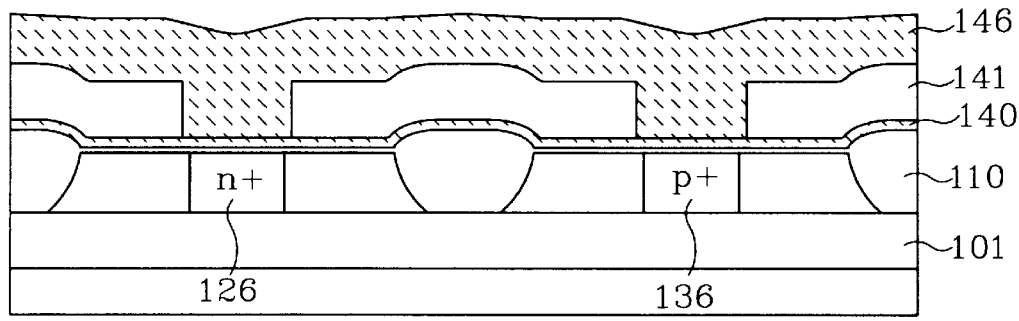
Figure 4F:
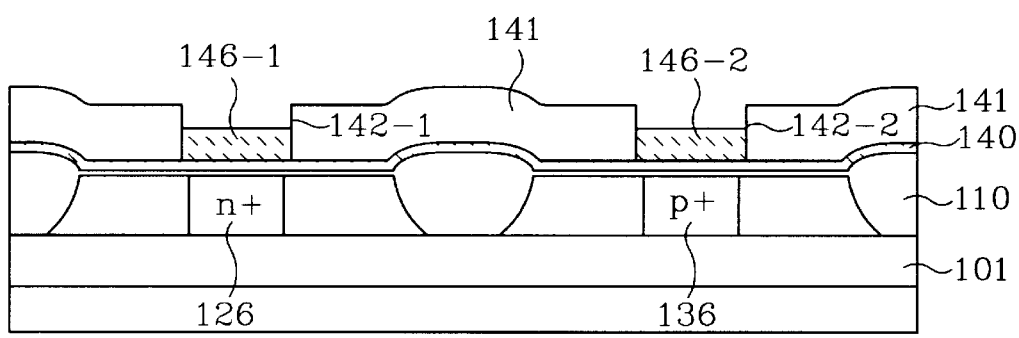

As shown in FIG. 4E, after all of the nitride spacers 143-1 and 143-2 on both sidewalls of the LTO layer 141 are removed, an undoped polysilicon layer 146 of preferably about 4000 to 5000 Å thick is then deposited over the whole surface of the substrate, filling up the windows 142-1 and 142-2. next, the polysilicon layer 146 is selectively removed by a well-known etch back process in the art until the top surface of the LTO layer 141 is exposed. The LTO layer 141 is used as an etching stopper during the etching back process. The etching back process is again performed until the polysilicon layer 146 remaining on the polysilicon layer 140 is partially removed to preferably be about 2000 Å thick within each window, as shown in FIG. 4F. The remaining polysilicon regions within the windows 142-1 and 142-2 are indicated by reference numerals 146-1 and 146-2 in FIG. 4F, respectively.

Figure 4G:
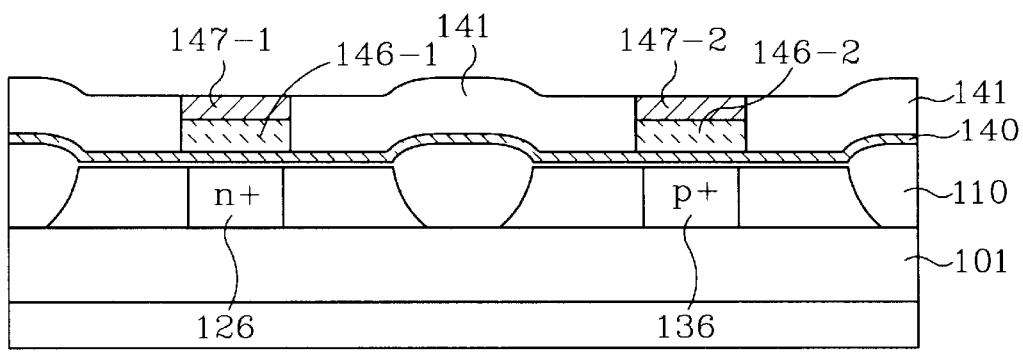

In FIG. 4G, tungsten silicide (WSi$_x$) regions 147-1 and 147-2 are formed on the polysilicon regions 146-1 and 146-2 within the windows, respectively. The tungsten silicide regions are formed by depositing a layer of tungsten silicide over the whole surface of the substrate and selectively etching back the deposited tungsten silicide layer until the top surface of the LTO layer 141 is exposed.

Figure 4H:
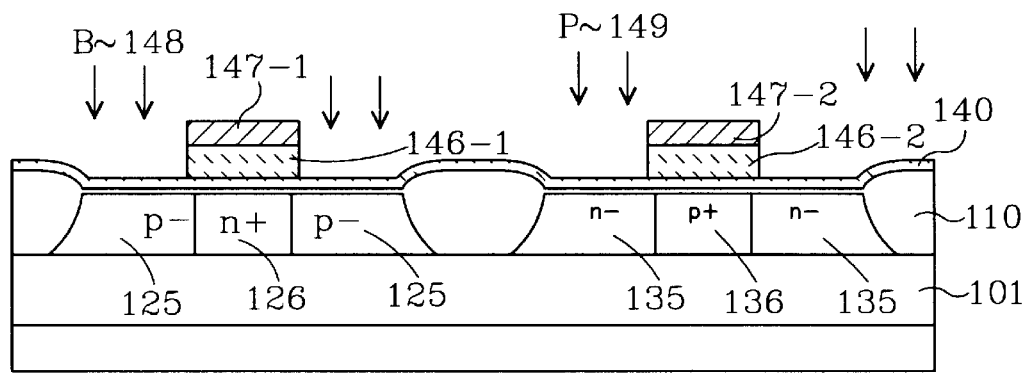

As shown in FIG. 4H, after the LTO layer 141 remaining on the polysilicon layer 140 is completely removed, a lightly doped channel region 125 is selectively formed by a p$^-$-type ion implantation using the source forming mask 125' (shown in FIG. 2). The p$^-$-type channel region 125 may be formed by lightly implanting boron ions 148 as dopants into the silicon layer 102 of the PMOS transistor region 120 to be formed on both sides of the n$^+$-type drain region 126. Also a lightly doped channel region 135 is selectively formed by an n$^-$-type ion implantation using the source forming mask 135' (shown in FIG. 2). The n$^-$-type channel region 135 may be formed by lightly implanting phosphorus ions 149 as dopants into the silicon layer 102 of the SOI substrate 100 to be formed on both sides of the p$^+$-type drain region 136. During the ion implantation, an amount of dopants is determined in consideration to each threshold voltage V$_{th}$ of the MOS transistors.

Figure 4I:
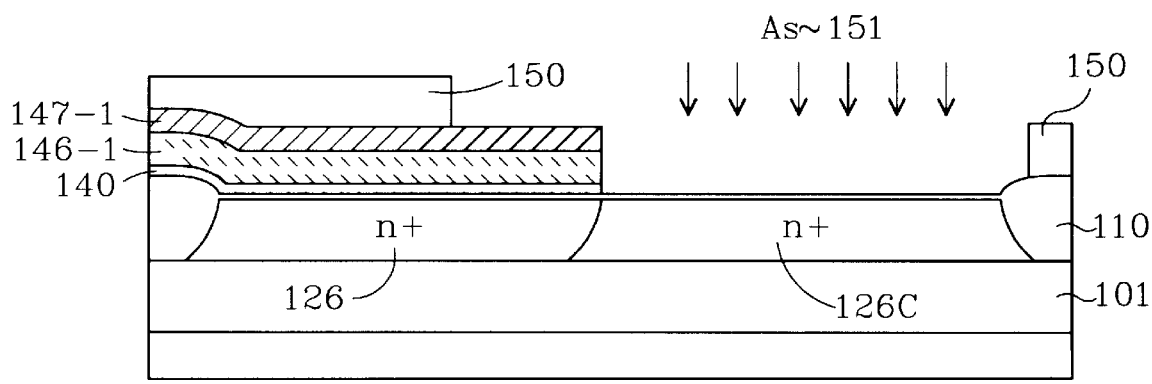

FIG. 4I is a cross-sectional view of the CMOS device taken along the line 4I—4I of FIG. 2 and shows the process step for forming a drain contact region when forming the PMOS transistor only. This process step is applicable to formation of the NMOS transistor.

Referring to FIG. 4I, a photoresist layer 150 is formed on the whole surface of the substrate and patterned to expose a surface part of the substrate where a drain contact region is formed. With an arsenic ion implantation using a drain forming mask 126' (shown in FIG. 2), arsenic ions 151 are heavily injected into the SOI substrate through the exposed surface part to form an n$^+$-type drain contact region 126C, which is electrically connected from the end of the polysilicon layer 146-1 to the drain region 126.

Similarly, a p$^+$-type drain contact region 136C (shown in FIG. 2) may be formed as in the formation of the n$^+$-type drain contact region 126C. For example, a photoresist layer is formed on the whole surface of the substrate and patterned to expose a surface part of the substrate where the p$^+$-type drain contact region is formed. With a boron ion implantation using a drain forming mask 136' (shown in FIG. 2), boron ions are injected into the SOI substrate through the exposed surface part to form the p$^+$-type drain contact region 136C.

Figure 4J:
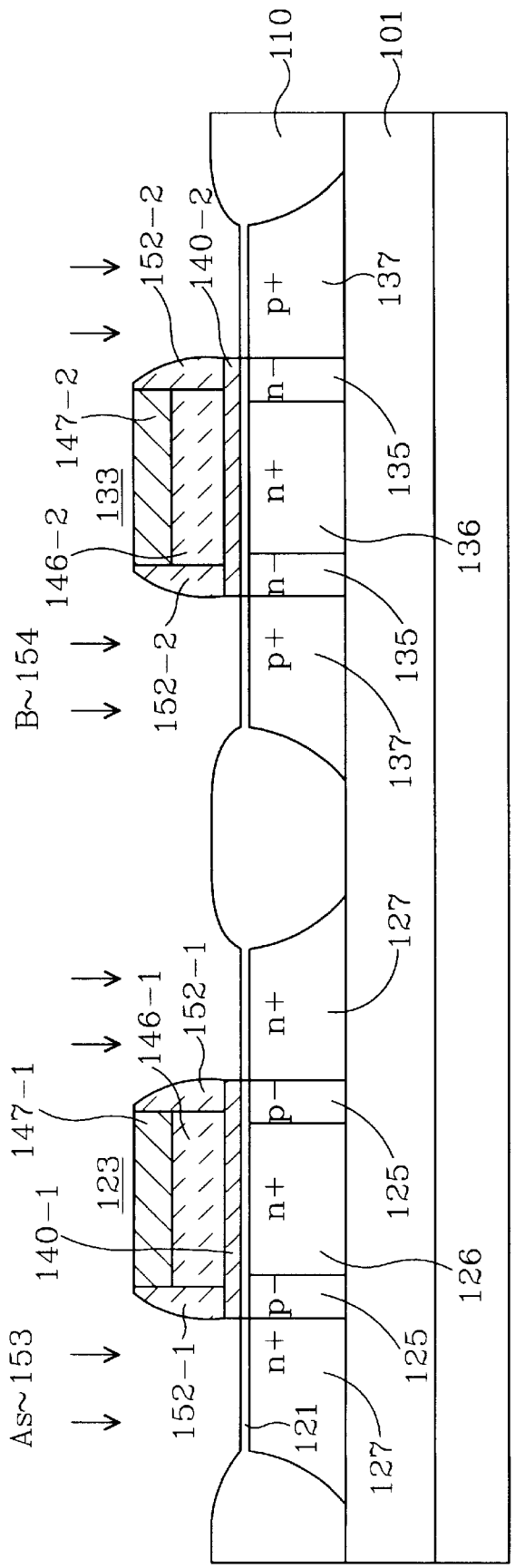

As illustrated by FIG. 4J, which is a cross-sectional view of the CMOS device taken along the line 3—3, polysilicon spacer 152-1 and 152-2 are formed on both sidewalls of the stacked polysilicon layer and tungsten silicide layer within each window. The spacers 152-1 and 152-2 may be formed by depositing an undoped polysilicon layer of about 1500 to 3000 Å thick on the whole surface of the substrate and then selectively etching the deposited polysilicon layer by an RIE process. The spacer 152-1 is formed on both sidewalls of the stacked polysilicon layer 146-1 and tungsten silicide layer 147-1 and the spacer 152-2 on both sidewalls of the stacked polysilicon layer 146-2 and tungsten silicide layer 147-2. During the RIE process, the polysilicon layer 140 is over-etched until the top surfaces of the gate oxide regions 121 and 131 are exposed. As a result, the polysilicon layer 140 is divided into two parts 140-1 and 140-2 as show in FIG. 4J. After the over-etching process, oxidation is performed to allow the gate oxide regions 121 and 131 to have about 200 Å in thickness.

In the CMOS device formed thus, the gate 123 of the n-type MOS transistor has a gate body 123-1 which comprises the polysilicon layers 140-1 and 146-1 and the tungsten silicide layer 147-1, and a polysilicon spacer 152-1 (123-2). Also the gate 133 of the p-type MOS transistor has a gate body 133-2 which comprises the polysilicon layers 140-2 and 146-2 and the tungsten silicide layer 147-2, and a polysilicon spacer 152-2 (133-2).

Turning again to FIG. 4J, n$^+$-type and p$^+$-type source regions 127 and 137 are formed in the PMOS and NMOS transistor regions 120 and 130, respectively. The n$^+$-type source region 127 may be formed by heavily injecting arsenic ions 153 into the PMOS transistor region 120 by an ion implantation using the source forming mask 125' (shown in FIG. 2). The p$^+$-type source region 137 also may be formed by heavily injecting boron ions 154 in the NMOS transistor region 130 by an ion implantation using the source forming mask 135' (shown in FIG. 2). During the ion implantation, the polysilicon spacer 152-1 of the PMOS transistor is heavily doped with n-type dopant (i.e., arsenic ions) and the spacer 152-2 of the NMOS transistor is heavily doped with p-type dopant (i.e., boron ions). As a result, a dual-gate CMOS functioning as a surface channel device may be formed.

According to the above described method, since the channel length of each MOS transistor is determined by the polysilicon spacer width, it is possible to control the channel length of each MOS transistor by using a well-known spacer forming technique in the art.

Finally, as shown again in FIG. 3, an interlayer insulating layer 160 is deposited on the whole surface of the substrate, and then selectively removed to form contact holes 128-1 and 138-1 for the MOS transistors. Metallization is then carried out to form source/drain electrodes 129-1 and 139-1. As a result, the fabrication of the CMOS device is terminated.

Figure 5:
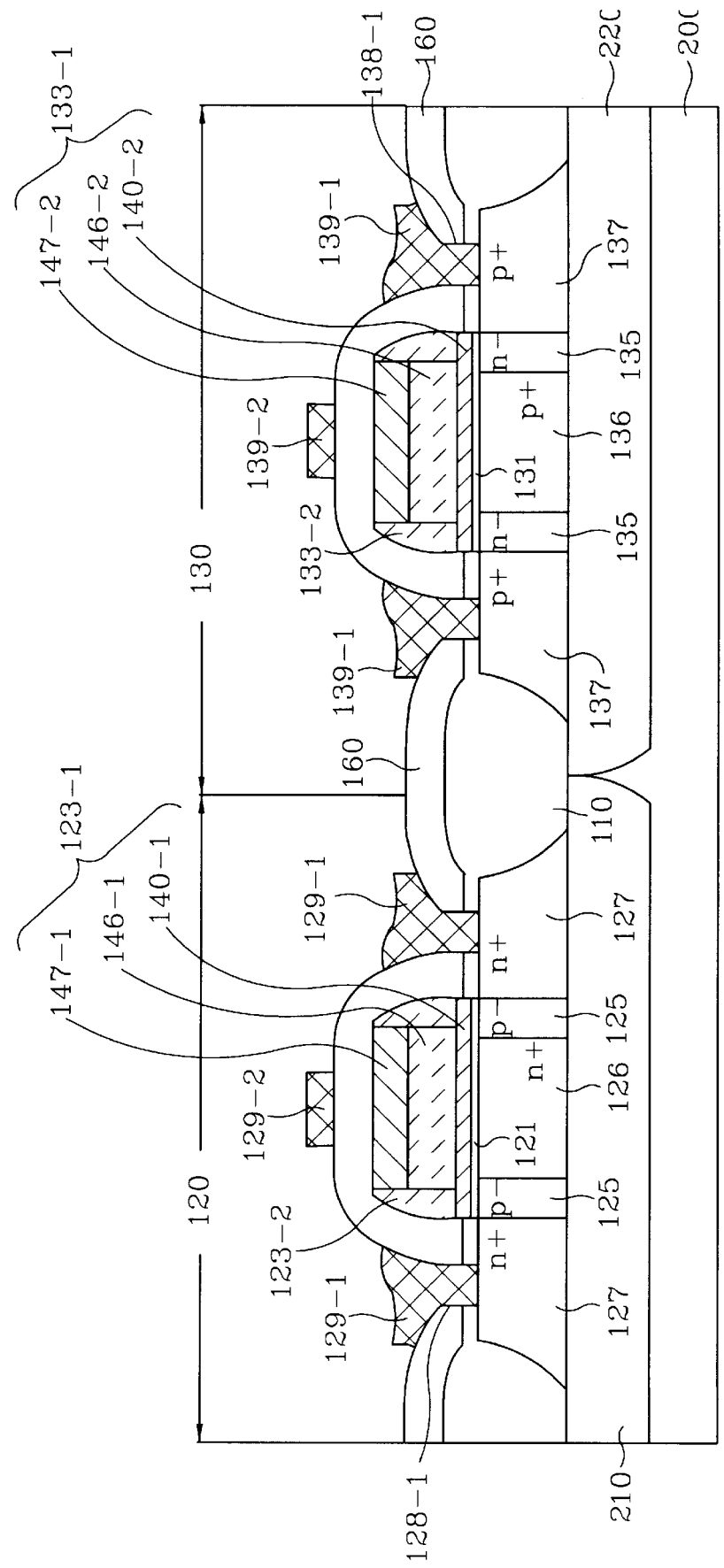
FIG. 5 illustrates a modification of the CMOS device shown in FIG. 3.

FIG. 5 illustrates a modification of the CMOS device shown in FIG. 3.

The CMOS device of FIG. 5 has the same construction as that of FIG. 3 except that a silicon substrate 200 is substituted for the SOI substrate 100, a p-type well 210 is formed in the silicon substrate 200 of a PMOS transistor region 120 and an n-type well 220 is formed in the same silicon substrate 200 of an NMOS transistor region 130.

As described above, in a CMOS device according to a first preferred embodiment of the present invention, each gate of MOS transistors is overlapped on a channel region as well as a drain region, so that a hot carrier effect caused by a short channel can be considerably reduced.

EXAMPLE 2

Figure 6:
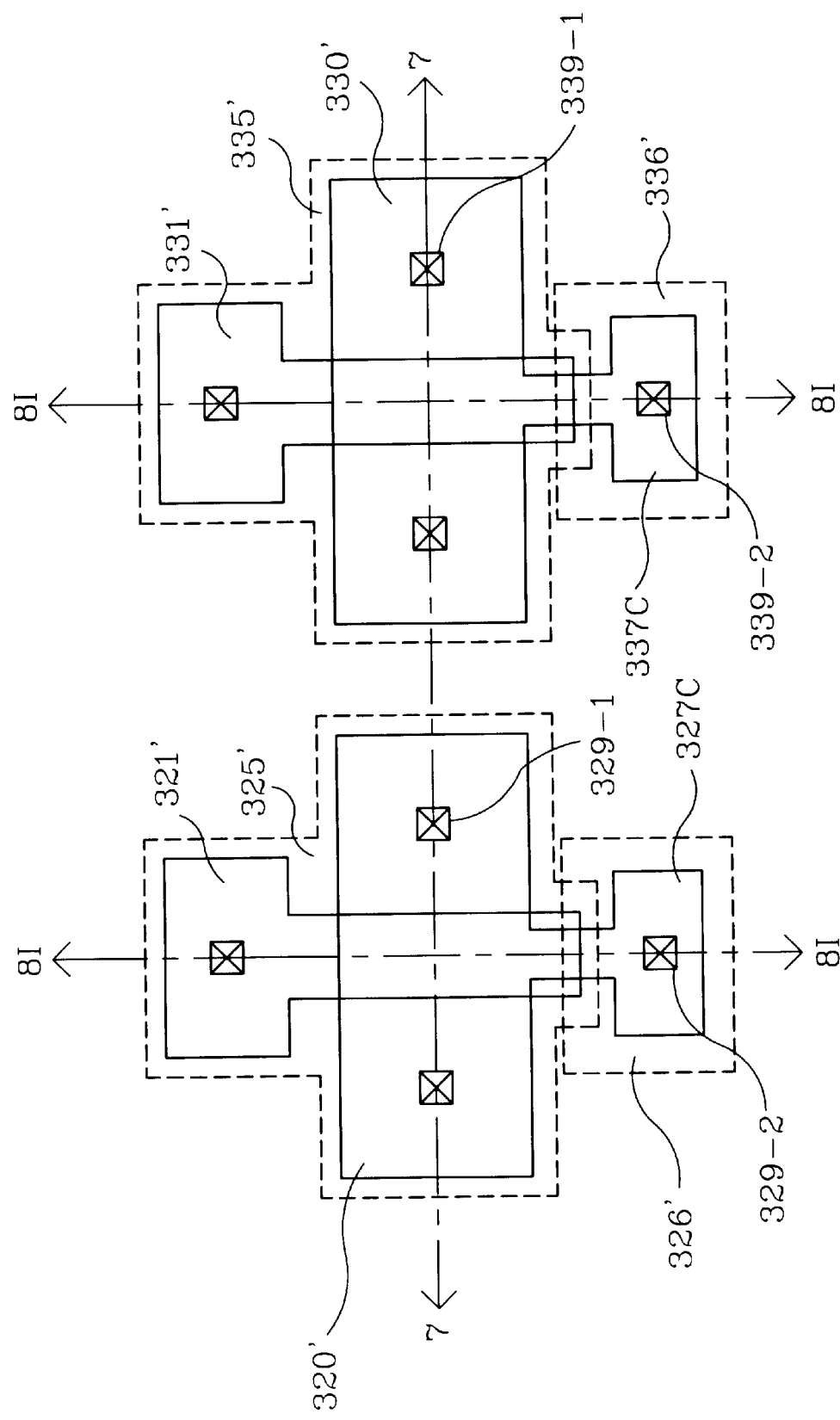
FIG. 6 is a view showing a layout of a CMOS device in accordance with a second preferred embodiment of the present invention.
Figure 7:
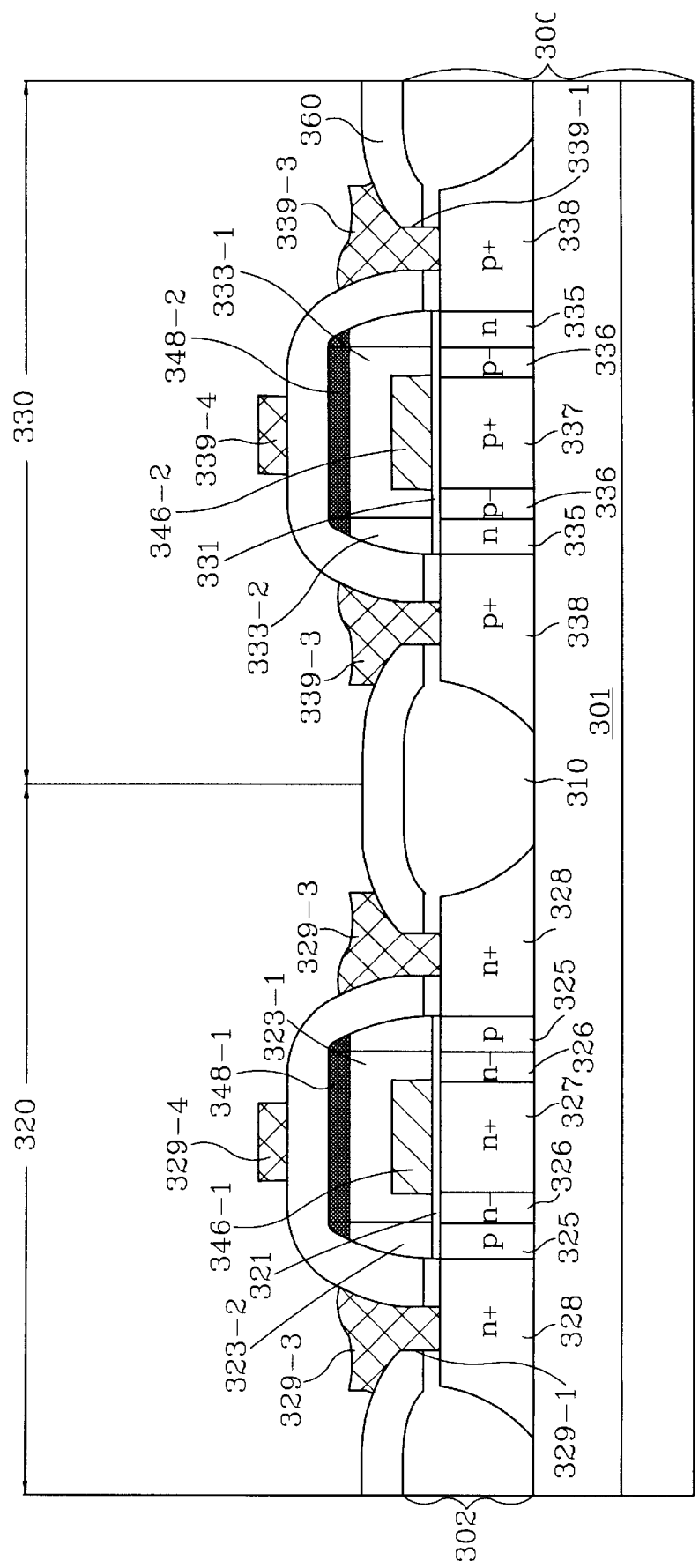
FIG. 7 is a cross-section view taken along the line 3'—3' of FIG. 6.

FIG. 6 shows a layout of a CMOS device in accordance with a second preferred embodiment of the present invention, and FIG. 7 shows a vertical structure of the CMOS device by a cross-section view taken along the line 7'—7' of FIG. 6.

Referring to FIG. 7, a novel CMOS device in accordance with the second preferred embodiment of the present invention includes an SOI substrate 300 wherein p-type and n-type MOS transistor regions 320 and 330 are defined by a device isolating region 310, a p-type MOS transistor formed in the p-type MOS transistor region 320 having an LDD structure, an n-type MOS transistor formed in the n-type MOS transistor region 330 having an LDD structure, and each gate of the MOS transistors is overlapped on a drain region as well as a channel region. Beneath each gate of the MOS transistors, two channel regions functioning as a dual-gate and a heavily doped drain region therebetween are formed. Between each channel region and the heavily doped drain region, a lightly doped drain region is formed to form an LDD structure. The device isolating region 310 is formed to the top surface of an insulating layer 301 which is formed in the SOI substrate, so that the transistor regions 320 and 330 are electrically isolated from each other. In the second preferred embodiment, the SOI substrate 300 comprises a silicon layer 302 of 1000 to 2000 Å thick which is formed on the insulating layer 301.

As shown again to FIG. 7, the PMOS transistor includes a gate insulating layer 321 which is formed on the SOI substrate 300, a gate 323 having a gate body 323-1 formed on the gate insulating layer 321 and a polysilicon spacer 323-2 formed on both sidewalls of the gate body 323-1, a first $n^+$-type impurity region 327 formed in the SOI substrate beneath the gate body 323-1, p-type impurity region 325 formed in the SOI substrate under the spacer 323-2 and on both sides of the first $n^+$-type impurity region 327, a second $n^+$-type impurity region 328 formed between the p-type impurity region 325 and the device isolating region 310, and two $n^-$-type impurity regions 326 each which is formed between each of the regions 325 and the first $n^+$-type impurity region 327. In the second preferred embodiment, the gate insulating layer 321 comprises an oxide layer. The first and second $n^+$-type impurity regions 327 and 328 function as drain and source regions doped with dopants of high concentration, respectively, and the p-type impurity region 325 functions as a dual-channel region. The $n^-$-type impurity region 326 functions as LDD regions.

Also, the NMOS transistor includes a gate insulating layer 331 which is formed on the SOI substrate 300, a gate 333 having a gate body 333-1 formed on the gate insulating layer 331 and a polysilicon spacer 333-2 formed on both sidewalls of the gate body 333-1, a first $p^+$-type impurity region 337 formed in the SOI substrate beneath the gate body 333-1, n-type impurity region 335 formed in the SOI substrate under the spacer 333-2 and on both sides of the first $p^+$-type impurity region 337, a second $p^+$-type impurity region 337 formed between the n-type impurity region 335 and the device isolating region 310, and two $p^-$-type impurity regions 336 each which is formed between each of the regions 335 and the first $p^+$-type impurity region 337. In the second preferred embodiment, the gate insulating layer 331 comprises an oxide layer. The first and second $p^+$-type impurity regions 337 and 338 function as drain and source regions doped with dopants of high concentration, respectively, and the n-type impurity regions 335 function as a dual-channel region. The $p^-$-type impurity regions 336 function as LDD regions.

With reference again to the FIGS. 6 and 7, the CMOS device further includes an interlayer insulating layer 360 formed over the substrate, a contact hole 329-1 formed on the source region 328 for the PMOS transistor, a contact hole 339-1 formed on the source region 338 for the NMOS transistor, and a source electrode 329-3 of the PMOS transistor formed on the interlayer insulating layer 360 and connected to the source region 328 through the contact hole 329-1, and a source electrode 339-3 of the NMOS transistor formed on the interlayer insulating layer 360 and connected to the source region 338 through the contact hole 339-1. Since the heavily doped drain regions 327 and 337 for the MOS transistors are formed beneath the gates 323 and 333, respectively, the contact holes for forming drain electrodes are not shown in FIGS. 6 and 7. The contact holes for forming drain electrodes are formed in drain contact regions 327C and 337C (shown in FIG. 6), each of which extends from a corresponding drain regions to the end of a corresponding gate.

In the CMOS device, the gate 323 for the PMOS transistor is overlapped on the drain regions 326 and 327 in addition to the channel regions 325, and the gate 333 for the NMOS transistor is overlapped on the drain regions 336 and 337 in addition to the channel regions 335. Thus, the occurrence of a hot carrier may be restrained. Since the channel regions 325 and 335 are formed in self-alignment by the polysilicon spacers 323-2 and 333-2 respectively, the channel length for each MOS transistor can be controlled to be about 0.1 mm.

In each MOS transistors of this example, a heavily doped drain region is not overlapped with a gate by an insulating layer 346-1, 346-2 on the gate insulating layer 321, 331, and thereby a parasitic capacitance between the gate and drain can be minimized.

A method for fabricating the CMOS device of FIG. 6 will be described below with reference to FIGS. 8A through 8J.

Figure 8A:
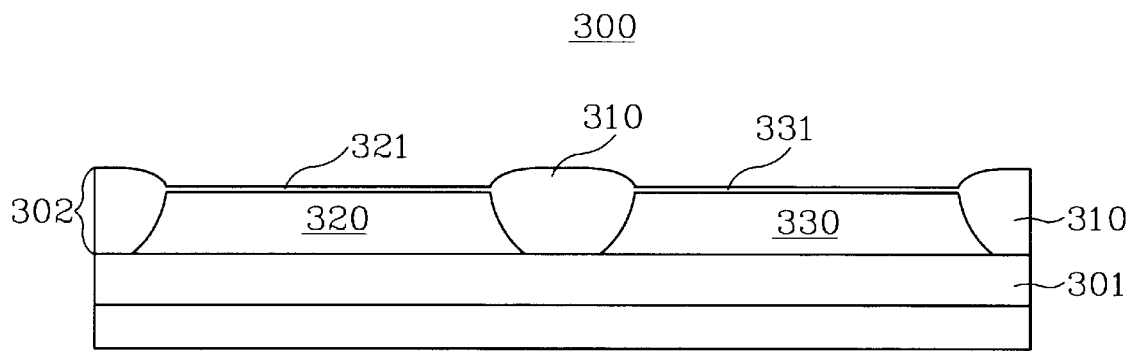

Referring to FIG. 8A, a SOI substrate 300 which has an insulating layer 301 (i.e., an oxide layer) therein and a silicon layer 302 of 1000 to 2000 Å is prepared. It is preferable in the second preferred embodiment to use the silicon layer 302 not to be doped with any dopant. Next, LOCOS is performed using an active region defining mask 320' or 330' (shown in FIG. 7), so that a device isolating region 310 is formed in contact with the insulating layer 301 of the SOI substrate 300. The silicon layer 102 is then divided into two regions, i.e., PMOS and NMOS transistor regions 320 and 330, which are electrically isolated by the device isolating region 310. And, a thin oxide layer is formed by thermally oxidizing a face of the SOI substrate 300. The thin oxide layer is formed in the range of 150 to 200 Å thick and divided into two oxide regions, one of which is formed on the PMOS transistor region 320 to be used as a gate insulating layer 321 for a PMOS transistor, and the other on the NMOS transistor region 330 to be used as a gate insulating layer 331 for an NMOS transistor.

Figure 8B:
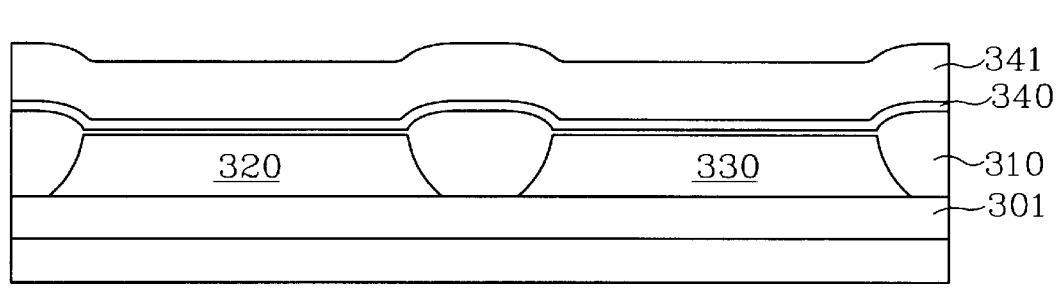

As shown in FIG. 8B, on the whole surface of the substrate 300, a polysilicon layer 340 and an nitride layer 341 are sequentially formed. The polysilicon layer 340 then is not doped with any kinds of dopants and has about 500 Å thick. The nitride layer 341 formed on the polysilicon layer 340 has a thickness of 3000 to 4000 Å.

Figure 8C:
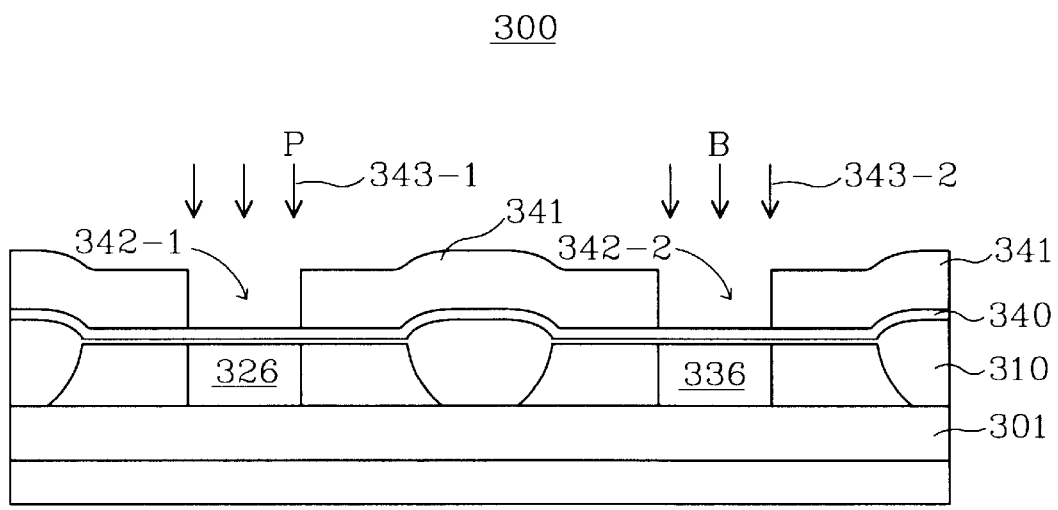

As shown in FIG. 8C, an etching process is performed using a gate forming mask 321' or 331' (shown in FIG. 6) to selectively remove the nitride layer 341 and thus form windows 342-1 and 342-2 in the transistor regions 320 and 330 respectively. The undoped polysilicon layer 340 is then used as an etching stopper during the above etching process.

Subsequently, an n⁻-type ion implantation, i.e., phosphorus ion implantation, is performed using a source forming mask 325' (shown in FIG. 6), phosphorus ions 343-1 are lightly injected into the SOI substrate 300 through the window 342-1 to form a lightly doped drain region 326 in the PMOS transistor region 320. Also when a p⁻ion implantation, i.e., boron ion implantation, is performed using the source forming mask 335' (shown in FIG. 6) again, boron ions 343-2 are lightly injected into the SOI substrate 300 through the window 342-2 to form a lightly doped drain region 336 in the NMOS transistor region 330.

Next, as shown in FIG. 8D, an undoped polysilicon layer of about 1500 Å thick is deposited over the substrate, and then selectively removed by an RIE process, so that spacers 344-1 and 344-2 are formed on sidewalls of each nitride layer 341 in each windows 342-1 and 342-2. Using the spacers 344-1 and 344-2 as a mask, an etching process is performed to remove the exposed portion of the polysilicon layer 340 until a top surface of the nitride layer 341 is exposed. Also, an n⁺-type ion implantation, i.e., arsenic ion implantation, is performed using the source forming mask 325' (shown in FIG. 6), so that arsenic ions 345-1 are heavily injected into the drain region 326 through the window 342-1 to form an n⁺-type drain region 327 of high concentration in the PMOS transistor region 320, as shown in FIG. 8D. And a p⁺-type ion implantation, i.e., boron ion implantation, is performed using the source forming mask 335' (shown in FIG. 6), boron ions 345-2 are heavily injected into the drain region 336 through the window 342-1 to form a p⁺-type drain region 337 of high concentration in the NMOS transistor region 330, as shown in FIG. 8D. During the ion implantation processes, the spacer 344-1 is doped with arsenic ions and the spacer 344-2 with boron ions. With reference to FIG. 8E, an LTO layer 346 is deposited over the substrate, filling up the windows. The LTO layer 346 has a thickness of about 5000 to 7000 Å.

Next, after the deposition of a photoresist pattern over the LTO layer 346, a well-known etch back process in the art is performed to remove the LTO layer 346 until portions 346-1 and 346-2 of the LTO layer 346 remain with a half depth of the each window half, as shown in FIG. 8F. The LTO portions 346-1 and 346-2 are provided to prevent a gate (to be formed by following process) and the heavily lightly doped drain region of each transistors from being overlapped with each other. As a result, a capacitance $C_{GD}$ between the gate and drain can be reduced owing to each LTO portion.

As illustrated in FIG. 8G, after sequentially depositing an undoped polysilicon layer 347 and a tungsten silicide (WSi$_x$) layer 348 of about 4000 Å thick over the whole surface of the substrate, an etching back process is performed using a photoresist pattern as a mask until the top surface of the nitride layer 341 is exposed. As a result, in the windows 342-1 and 342-2, the stacked polysilicon and tungsten silicide regions remain only on the LTO portions 346-1 and 346-2, respectively. Each tungsten silicide layer is provided to electrically connect poly-gates of transistors to each other and to prevent impurity ions of a different conductivity from being injected therein during the ion implantation for forming a channel region.

Figure 8H:
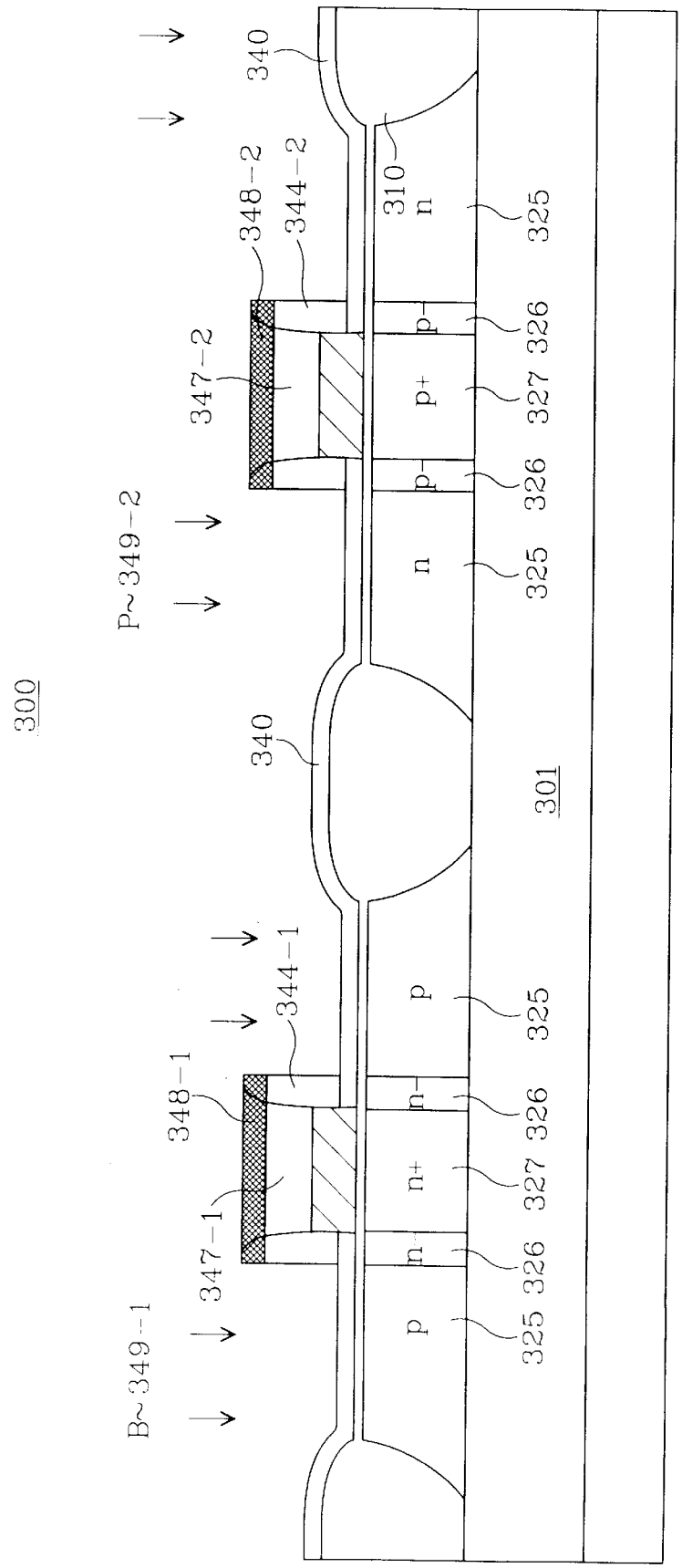

Subsequently, as shown in FIG. 8H, after the removal of the nitride layer 341 remaining on the polysilicon layer 340, if a p-type ion implantation, i.e., boron ion implantation, is performed using the above source forming mask 325' (shown in FIG. 6) again, boron ions 349-1 are lightly injected into the SOI substrate 300 to form a p-type channel region 325 of low concentration at both sides of the n⁻-type drain region 326 (i.e., LDD region). Also if an n-type ion implantation, i.e., phosphorus ion implantation, is performed using the source forming mask 335' (shown in FIG. 6) again, phosphorus ions 349-2 are lightly injected into the SOI substrate 300 to form an n-type channel region 335 of low concentration at both sides of the p⁻-type drain region 336 (i.e., LDD region). In the ion implantation for forming the channel regions 325 and 335, the injection amount of boron or phosphorus ions is determined according to each threshold voltage $V_{th}$ of the MOS transistors.

Figure 8I:
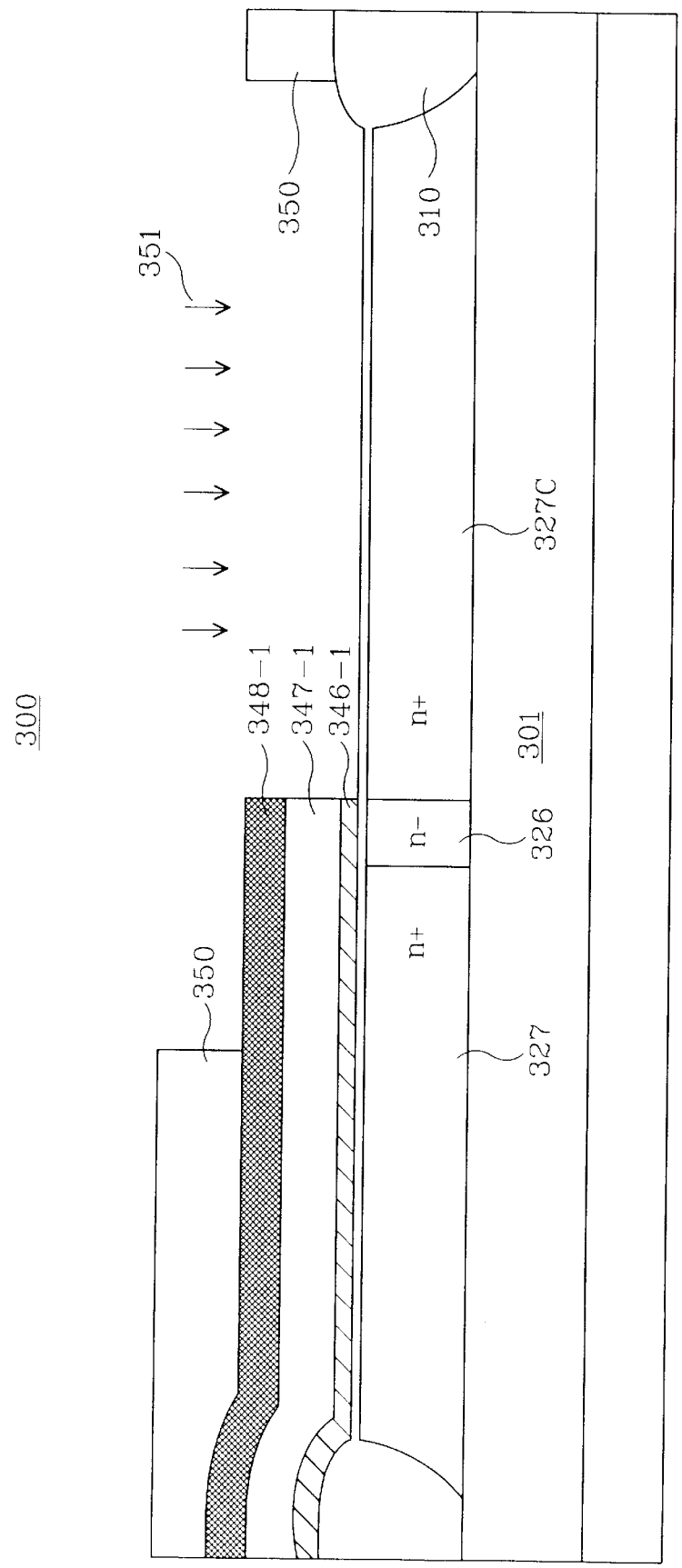

FIG. 8I is a cross-sectional view of the CMOS device taken along the line 8I'—8I' of FIG. 6 and shows the process step for forming a drain contact region in case of forming the PMOS transistor only. This process step is applicable to fabrication of the NMOS transistor.

On the whole surface of the substrate, a photoresist layer 350 is formed and patterned to expose a surface part of the substrate where a drain contact region is formed. Next if arsenic ion implantation is performed using an n⁺-type drain forming mask 326' (shown in FIG. 6), arsenic ions are heavily injected into the SOI substrate through the exposed surface part to form an n⁺-type drain contact region 327C, which is connected from the end of the polysilicon layer 347-1 to the drain region 327.

Similarly to the formation of the n⁺-type drain contact region 327C, a p⁺-type drain contact region 337C (not shown in FIG. 8I) is formed. For example, a photoresist layer is formed on the whole surface of the substrate and patterned to expose a surface part of the substrate where the p⁺-type drain contact region is formed. Next if a boron ion implantation is performed using the drain forming mask 336' (shown in FIG. 6), boron ions are heavily injected into the SOI substrate through the exposed surface part to form the p⁺-type drain contact region 337C, as shown in FIG. 6, which is connected from the end of the polysilicon layer 347-2 to the drain region 337.

As shown in FIG. 8J, an undoped polysilicon layer 352 of about 1500 to 3000 Å thick is deposited on the whole surface of the substrate and then selectively removed by an RIE process to form spacers 352-1 and 352-2 on both sidewalls of each poly-gate. During the above RIE process, the exposed polysilicon layer 340 is over-etched. As a result, the spacer 352-1 is formed on both sidewalls of the poly-spacer 344-1 and the tungsten silicide portion 348-1 and the spacer 352-2 is formed on both sidewalls of the poly-spacer 344-2 and the tungsten silicide portion 348-2.

The gate of each MOS transistor is constituted by the polysilicon layers 340, 344, 347 and 352 and the tungsten silicide layer 348. For example, the gate 323 of the n-type MOS transistor has a gate body 323-1 which comprises the polysilicon layers 344-1 and 347-1 and the tungsten silicide portion 348-1, and a spacer 323-2 which comprises the polysilicon layers 340-1 and 352-1. Also the gate 333 of the p-type MOS transistor has a gate body 333-2 which comprises the polysilicon layers 344-2 and 347-2 and the tungsten silicide portion 348-2, and a spacer 333-2 which comprises the polysilicon layers 340-2 and 352-2.

With reference again to FIG. 8J, when an arsenic ion implantation is performed using the source forming mask 325' (shown in FIG. 6), arsenic ions 353-1 are heavily injected into the PMOS transistor region 320 to form an n⁺-type source region 328 of high concentration. Next, if a boron ion implantation is performed using the source forming mask 335', boron ions 353-2 are heavily injected into the NMOS transistor region 330 to form a p⁺-type source region 338 of high concentration. During the ion implantation, the spacers 352-1 and 352-2 and the polysilicon layer 340-1 and 340-2 are doped with the same conductivity as that of the MOS transistor. For example, the spacer 352-1 of the PMOS transistor is doped with n$^+$-type dopant (i.e., arsenic ions) and the spacer 352-2 of the p-type MOS transistor is doped with p$^+$-type dopant (i.e., boron ions). As a result, a dual-gate transistor may be formed as a surface channel transistor.

According to the above described method, since the channel length of each MOS transistor is determined by the spacer width, it is possible to control the channel length of each MOS transistor in accordance with a spacer forming technique. Therefore, by using the method of the present invention, a semiconductor device having a channel length of about 0.1 mm can be fabricated regardless of a photolithography.

Finally, as shown again in FIGS. 6 and 7, an interlayer insulating layer 360 is deposited on the whole surface of the substrate, and then selectively removed to form contact holes 329-1 and 329-2 for the PMOS transistor and contact holes 339-1 and 339-2 for the NMOS transistor. Metallization is carried out to form source/drain electrodes 329-3, 329-4, 339-3 and 339-4. As a result, the CMOS device may be completely fabricated.

Figure 9:
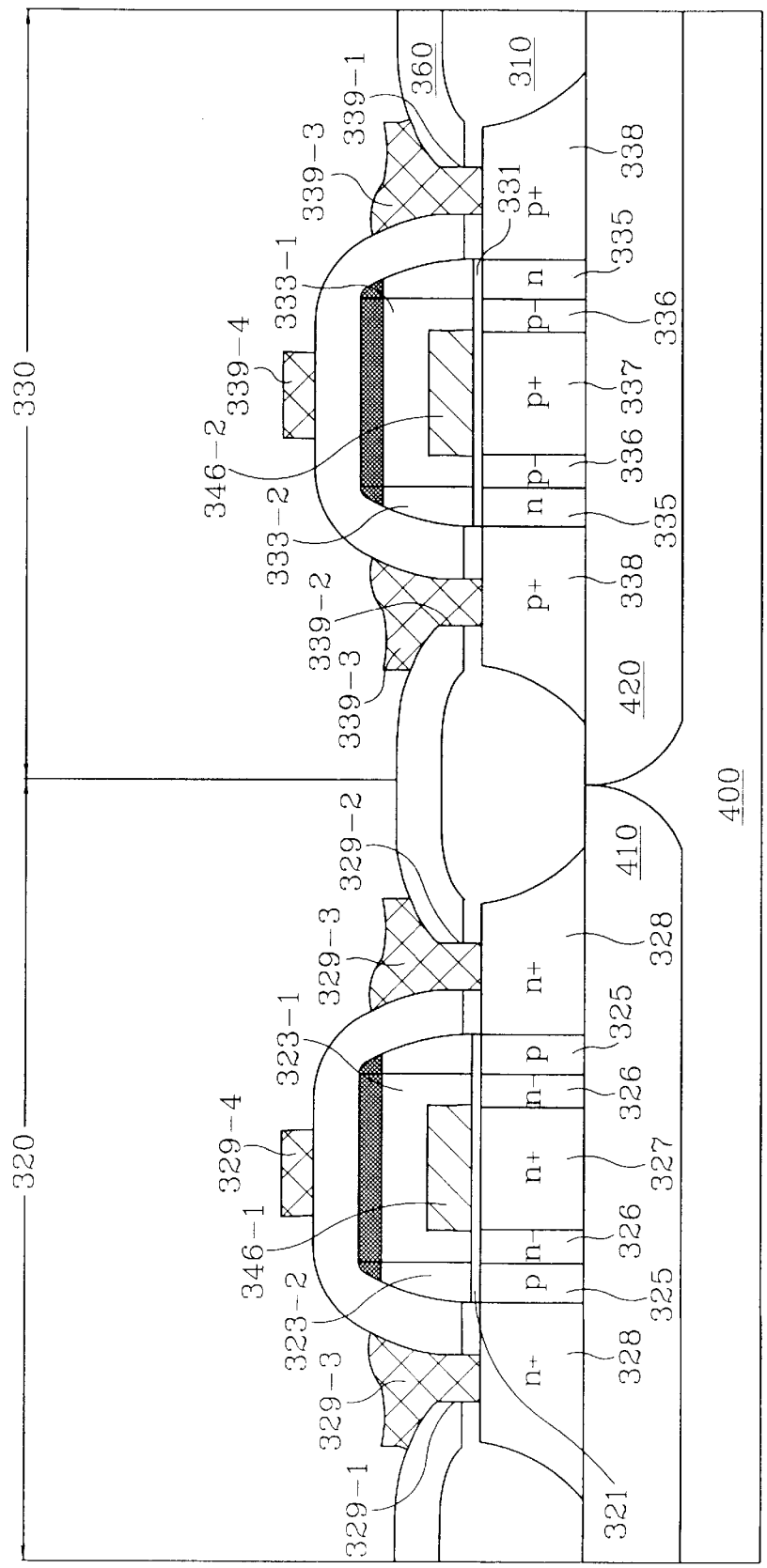
FIG. 9 illustrates a modification of the CMOS device shown in FIG. 7.

FIG. 9 illustrates a modification of the CMOS device shown in FIG. 7.

The CMOS device of FIG. 9 has the same construction as that of FIG. 7, except that a silicon substrate 400 is substituted for the SOI substrate 300, a p-type well 410 is formed in the silicon substrate 400 of a PMOS transistor region and an n-type well 420 is formed in of the same silicon substrate 400 of an NMOS transistor region.

In the CMOS device according to the modification, since a channel region thereof can be defined by a polysilicon spacer, an LDD region having a channel length of 0.1 mm can be formed. Also, since a gate is completely overlapped in the LDD region as well as the channel region, a short channel of the device can be obtained. As a result, a hot-carrier effect can be reduced.

Furthermore, since the CMOS device according to the invention has a dual surface channel region, a short channel effect caused by a conventional buried channel region can be prevented.

Moreover, since each transistor in the CMOS device has two source regions with a drain region interposed therebetween, a current driving capacity thereof can be improved.

Additionally, since there is a thick oxide layer on the drain region in the CMOS device, a parasitic capacitance between the gate and drain can be minimized.

Finally, since the source regions of high concentration are in self-alignment formed at both sides of the drain region, a source resistance can be reduced. That is, since an LDD is formed in the drain region only, but not in the source region, the source resistance can be reduced.

The present invention is not limited to the above-described embodiments. Various changes and modifications may be effected by one having an ordinary skill in the art and remain within the scope of the invention, as defined by the appended claims.

What is claimed is:

1. A semiconductor device, comprising:
    n-channel and p-channel MOS (metal oxide semiconductor) transistors which are electrically isolated by a device isolating region on a same SOI (silicon on insulator) substrate; and
    each of the MOS transistors having
        a gate insulating layer formed on the substrate;
        a gate having a gate body and a spacer formed on both sidewalls of the gate body;
        a drain region of a first conductivity type formed in the substrate and beneath the gate body;
        a channel region of a second conductivity type formed at both sides of the drain region and beneath the spacer; and
        a source region of the first conductivity type formed in the substrate and between the channel regions and the device isolating region.

2. The semiconductor device of claim 1, wherein said device isolating region is formed in contact with an insulating layer of the SOI substrate to electrically isolate the MOS transistors on the substrate.

3. The semiconductor device of claim 1, wherein said drain region is doped with dopants of high concentration.

4. The semiconductor device of claim 1, wherein said channel region is doped with dopants of low concentration.

5. The semiconductor device of claim 1, wherein said gate body comprises a first polysilicon layer formed on the gate insulating layer, a second polysilicon layer stacked partially on the first polysilicon layer, and a conductive layer formed on the second polysilicon layer.

6. The semiconductor device of claim 1, wherein said conductive layer is formed of a tungsten silicide layer.

7. The semiconductor device of claim 1, wherein said spacer is formed of a third polysilicon layer.

8. A semiconductor device comprising:
    a silicon substrate;
    two well regions of different conductivity type formed on the same silicon substrate;
    n-channel and p-channel MOS (metal oxide semiconductor) transistors which are respectively formed on the two well regions and electrically isolated by a device isolating region on the same silicon substrate; and
    each of the MOS transistors having a gate insulating layer formed on the substrate; a gate having a gate body and a spacer formed on both sidewalls of the gate body; a drain region of a first conductivity type formed in the substrate and beneath the gate body; a channel region of a second conductivity type formed at both sides of the drain region and beneath the spacer; and a source region of the first conductivity type formed in the substrate and between the channel region and the device isolating region.

9. A semiconductor device comprising:
    n-channel and p-channel MOS (metal oxide semiconductor) transistors which are electrically isolated by a device isolating region on a same SOI (silicon on insulator) substrate; and
    each of the MOS transistors having a gate insulating layer formed on the substrate; an insulator formed on a part of the gate insulating layer; a gate surrounding the insulator and having a gate body and a spacer formed on both sidewalls of the gate body; a heavily doped drain region of a first conductivity type formed in the substrate and beneath the insulator; a lightly doped drain region of the first conductivity type formed at both sides of the heavily doped drain region and beneath the gate body; a channel region of a second conductivity type formed between the lightly doped drain region and the device isolating region and beneath the spacer; and a source region of the first conductivity type formed in the substrate and between the channel region and the device isolating region.

10. The semiconductor device of claim 9, wherein said device isolating region is formed in contact with an insulating layer of the SOI substrate to electrically isolate the MOS transistors on the substrate.

11. The semiconductor device of claim 9, wherein said source region is doped with dopants of high concentration.

12. The semiconductor device of claim 9, wherein said channel region is doped with dopants of low concentration.

13. The semiconductor device of claim 9, wherein said gate body comprises a first polysilicon layer formed on the insulator, a sidewall spacer formed on both sides of the insulator and the first polysilicon layer, and a conductive layer formed on the first polysilicon layer and the sidewall spacer.

14. The semiconductor device of claim 13, wherein said conductive layer is made of a tungsten silicide layer.

15. The semiconductor device of claim 13, wherein said sidewall spacer is made of polysilicon.

16. The semiconductor device of claim 9, wherein said insulator is made of a low temperature oxide layer.

17. A semiconductor device comprising:

a silicon substrate;

two well regions of different conductivity type formed on the same silicon substrate;

n-channel and p-channel MOS (metal oxide semiconductor) transistors which are respectively formed on the two well regions and electrically isolated by a device isolating region on the same silicon substrate; and each of the MOS transistors having a gate insulating layer formed on the substrate; an insulator formed on a part of the gate insulating layer; a gate surrounding the insulator and having a gate body and a spacer formed on both sidewalls of the gate body; a heavily doped drain region of a first conductivity type formed in the substrate and beneath the insulator; a lightly doped drain region of the first conductivity type formed at both sides of the heavily doped drain region and beneath the gate body; a channel region of a second conductivity type formed between the lightly doped drain region and the device isolating region and beneath the spacer; and a source region of the first conductivity type formed in the substrate and between the channel region and the device isolating region.

* * * * *